US012313647B2

(12) United States Patent
Jin

(10) Patent No.: US 12,313,647 B2
(45) Date of Patent: May 27, 2025

(54) SENSOR UNIT, ELECTRONIC APPARATUS, AND MOVING OBJECT

(71) Applicant: SEIKO EPSON CORPORATION, Tokyo (JP)

(72) Inventor: Mikimoto Jin, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 18/508,724

(22) Filed: Nov. 14, 2023

(65) Prior Publication Data

US 2024/0085452 A1  Mar. 14, 2024

Related U.S. Application Data

(63) Continuation of application No. 17/125,262, filed on Dec. 17, 2020, now abandoned.

(30) Foreign Application Priority Data

Dec. 20, 2019  (JP) ................................. 2019-230175

(51) Int. Cl.
| | |
|---|---|
| *G01P 15/18* | (2013.01) |
| *B81B 3/00* | (2006.01) |
| *G01P 1/02* | (2006.01) |
| *G01P 15/09* | (2006.01) |
| *G01P 15/14* | (2013.01) |

(52) U.S. Cl.
CPC ............ *G01P 15/18* (2013.01); *B81B 3/0024* (2013.01); *G01P 1/023* (2013.01); *G01P 15/0922* (2013.01); *G01P 15/14* (2013.01); *B81B 2201/0235* (2013.01)

(58) Field of Classification Search
CPC .......... G01P 1/023; G01P 15/08; G01P 15/18; G01P 15/125; G01P 15/09; G01P 15/0922; G01P 15/14
See application file for complete search history.

(56) References Cited

U.S. PATENT DOCUMENTS

| | | | |
|---|---|---|---|
| 4,601,206 | A | 7/1986 | Watson |
| 6,301,964 | B1 | 10/2001 | Fyfe et al. |
| 6,338,199 | B1 | 1/2002 | Chigira et al. |
| 2008/0128838 | A1 | 6/2008 | Theuss |
| 2009/0158811 | A1* | 6/2009 | Kobayashi ............. G01C 25/00 702/96 |
| 2009/0271142 | A1 | 10/2009 | Yamashita et al. |
| 2010/0271787 | A1 | 10/2010 | Holzmann et al. |

(Continued)

FOREIGN PATENT DOCUMENTS

| | | |
|---|---|---|
| JP | 2009-031032 A | 2/2009 |
| JP | 2019-060689 A | 4/2019 |

*Primary Examiner* — Helen C Kwok
(74) *Attorney, Agent, or Firm* — Rankin, Hill & Clark LLP

(57) ABSTRACT

A sensor unit includes: a substrate; a first sensor module that is disposed at the substrate and that includes a first acceleration sensor; and a second sensor module that is disposed at the substrate and includes a second acceleration sensor, in which the first sensor module and the second sensor module are arranged to be adjacent to each other at one surface side of the substrate, the first acceleration sensor is eccentrically disposed at the second sensor module side in the first sensor module, and the second acceleration sensor is eccentrically disposed at the first sensor module side in the second sensor module.

8 Claims, 17 Drawing Sheets

(56) References Cited

U.S. PATENT DOCUMENTS

| | | |
|---|---|---|
| 2011/0179871 A1 | 7/2011 | Misawa et al. |
| 2012/0017676 A1 | 1/2012 | Schmid et al. |
| 2012/0078570 A1 | 3/2012 | Rothkopf et al. |
| 2012/0296601 A1 | 11/2012 | Eatwell |
| 2014/0283603 A1 | 9/2014 | Gunthner et al. |
| 2015/0276793 A1 | 10/2015 | Takenaka et al. |
| 2016/0069714 A1 | 3/2016 | Scheuing et al. |
| 2016/0131678 A1 | 5/2016 | Yaguchi et al. |
| 2017/0205519 A1 | 7/2017 | Robert et al. |
| 2017/0336436 A1 | 11/2017 | Maegawa et al. |
| 2018/0089841 A1 | 3/2018 | Dai et al. |
| 2019/0041424 A1 | 2/2019 | Noda et al. |
| 2021/0149020 A1* | 5/2021 | Pinnock .................. G01S 13/86 |

\* cited by examiner

SENSOR UNIT, ELECTRONIC APPARATUS, AND MOVING OBJECT

The present application is a continuation of and claims priority to U.S. application Ser. No. 17/125,262, filed Dec. 17, 2020, and is based on and claims priority from JP Application Serial Number 2019-230175, filed Dec. 20, 2019, the disclosures of which are hereby incorporated by reference herein in their entirety.

BACKGROUND

1. Technical Field

The present disclosure relates to a sensor unit, an electronic apparatus, and a moving object.

2. Related Art

For example, JP-A-2009-031032 describes an acceleration sensor unit including 9 or 16 MEMS acceleration sensors arranged in a 3×3 or 4×4 array over a single substrate and a circuit which electrically adds outputs of the MEMS acceleration sensors and then passes the resultant output through a bandwidth pass filter is included. With this configuration, an SN ratio can be improved according to a square root of the number of MEMS acceleration sensors.

Meanwhile, in the acceleration sensor unit having such a configuration, depending on a positional relationship between a plurality of acceleration sensors, accelerations received by the respective sensors may be different from each other and accuracy may be lowered.

SUMMARY

A sensor unit according to the present disclosure includes: a substrate; a first sensor module that is disposed at the substrate and includes a first acceleration sensor; and a second sensor module that is disposed at the substrate and includes a second acceleration sensor, in which the first sensor module and the second sensor module are arranged to be adjacent to each other at one surface side of the substrate, the first acceleration sensor is eccentrically disposed at the second sensor module side in the first sensor module, and the second acceleration sensor is eccentrically disposed at the first sensor module side in the second sensor module.

An electronic apparatus according to the present disclosure includes: the sensor unit described above; and a control circuit that performs a control based on a detection signal output from the sensor unit.

A moving object according to the present disclosure includes: the sensor unit described above; and a control circuit that performs a control based on a detection signal output from the sensor unit.

DESCRIPTION OF EXEMPLARY EMBODIMENTS

Hereinafter, a sensor unit, an electronic apparatus, and a moving object according to the present disclosure will be described in detail with reference to embodiments illustrated in the accompanying drawings.

First Embodiment

Figure 1:
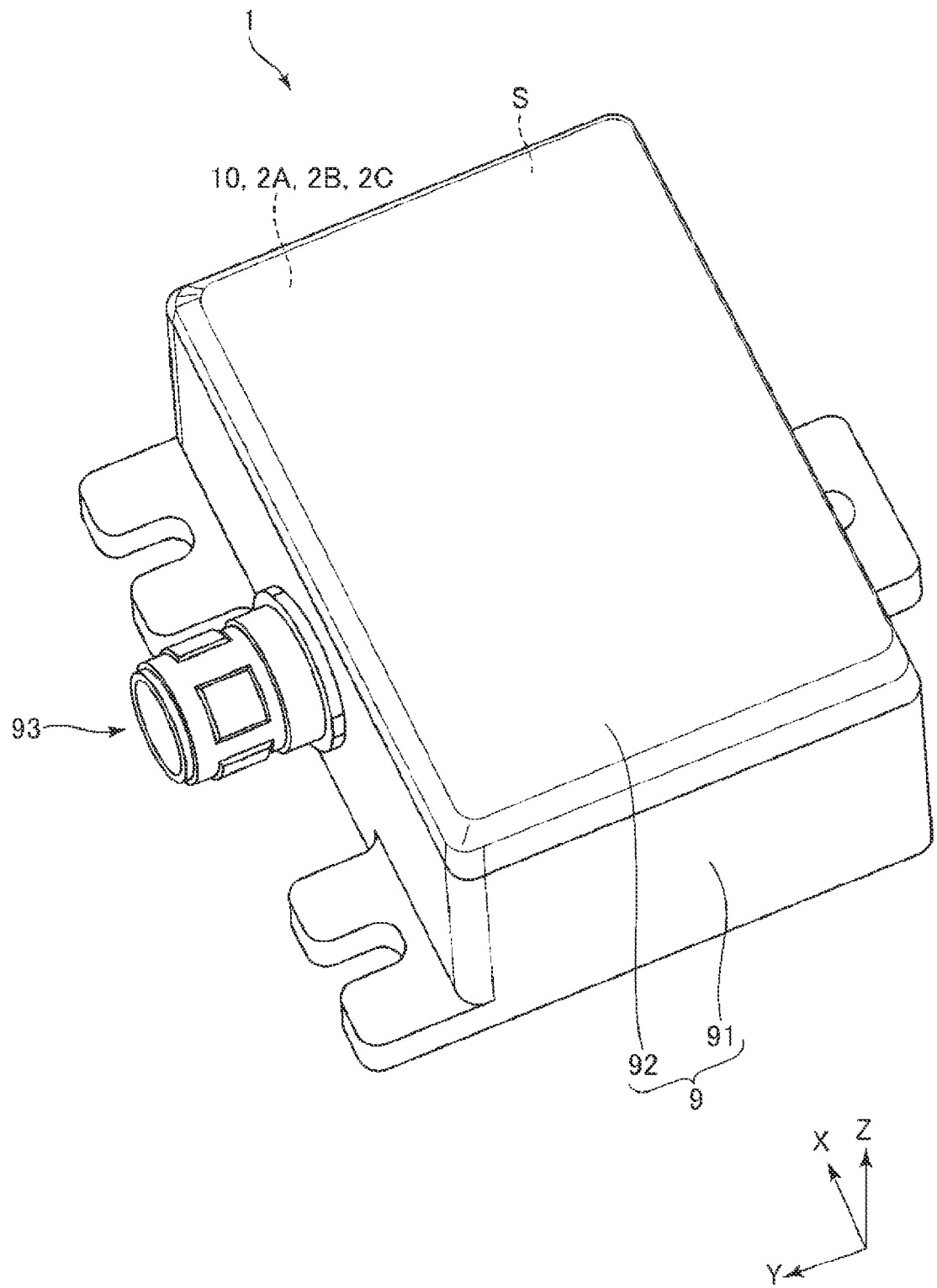
FIG. 1 is a perspective view illustrating a sensor unit according to a first embodiment of the present disclosure.
Figure 2:
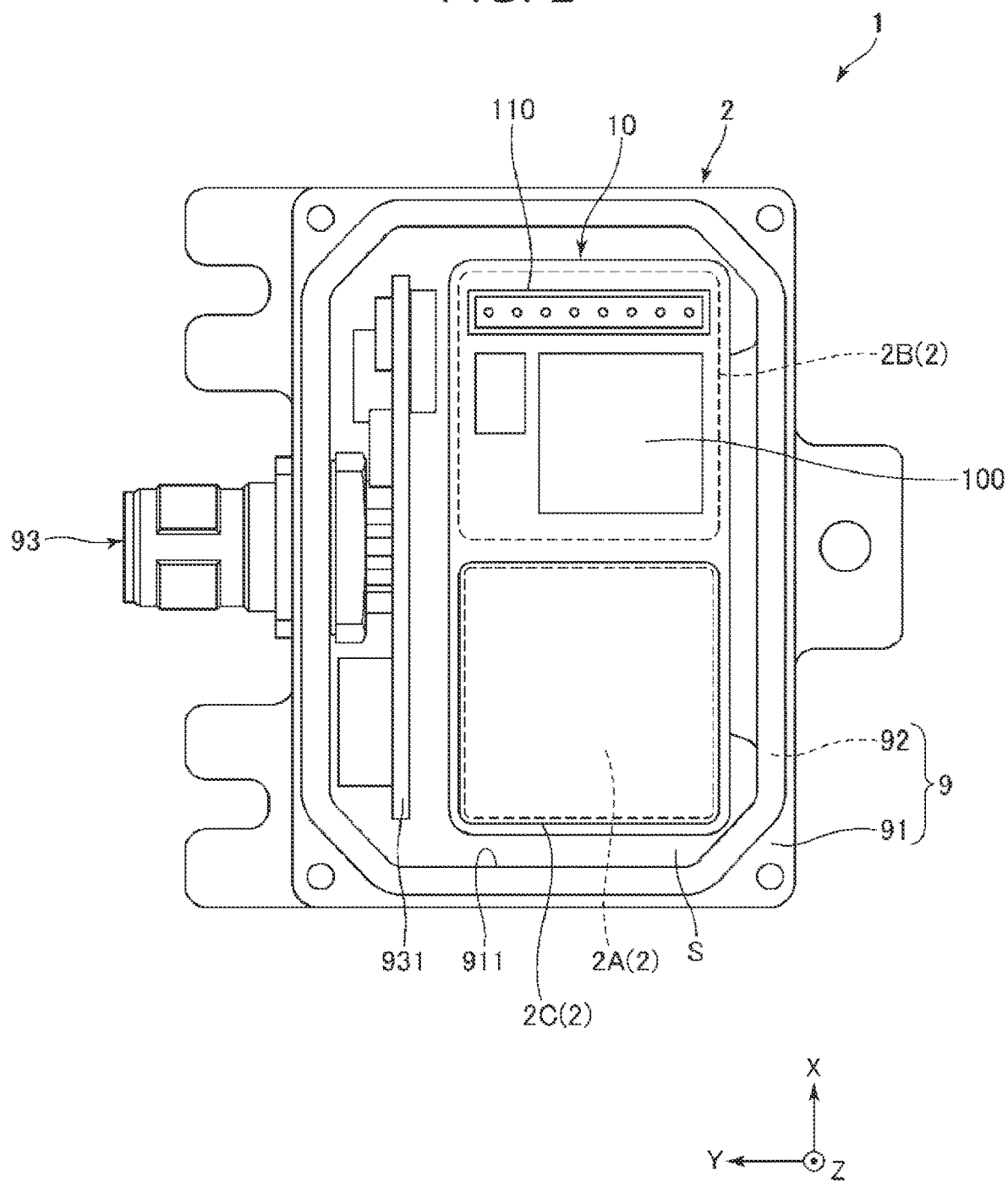
FIG. 2 is a plan view illustrating an inside of the sensor unit illustrated in FIG. 1.
Figure 3:
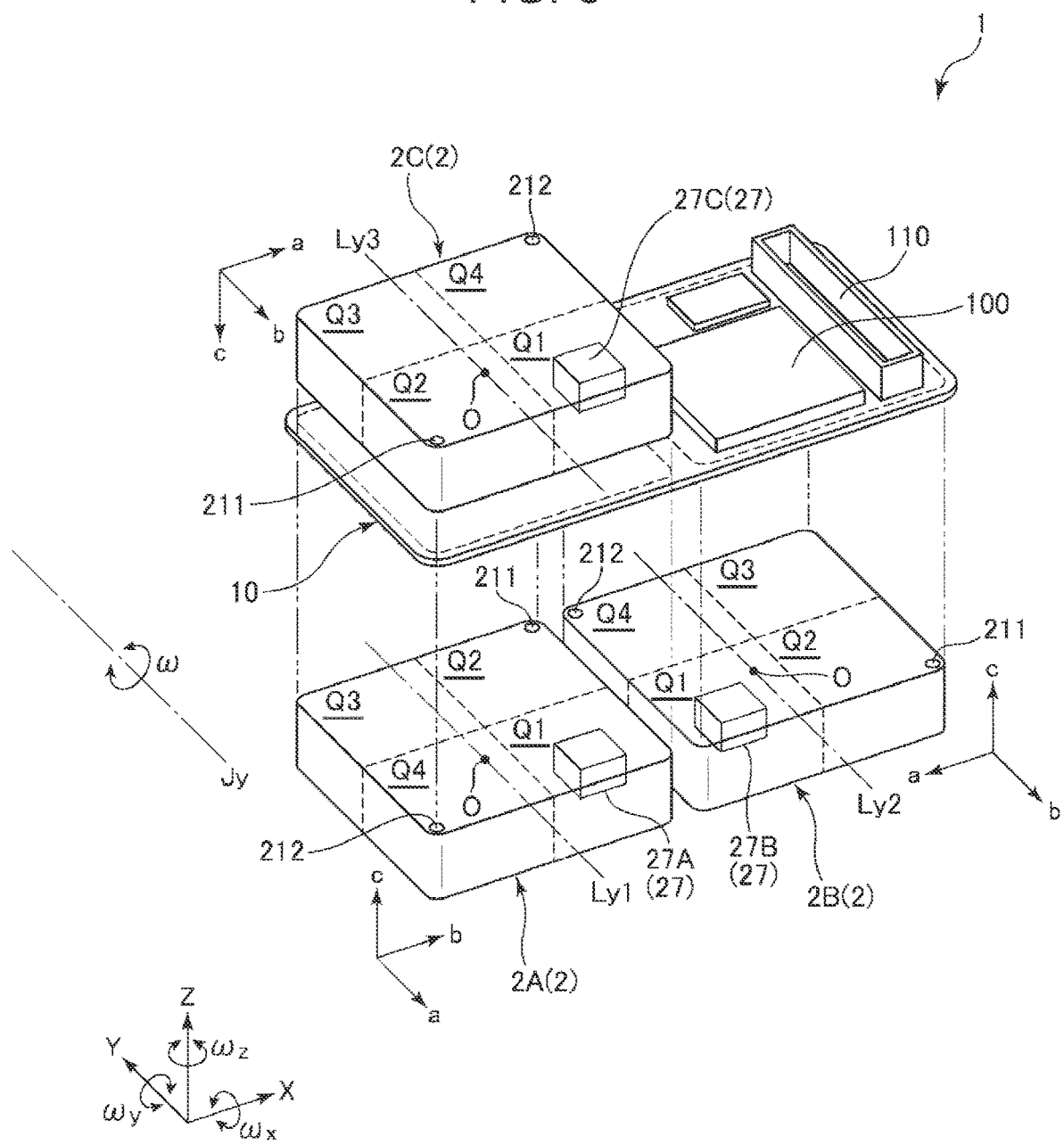
FIG. 3 is an exploded perspective view illustrating a substrate and three sensor modules arranged at the substrate.
Figure 4:
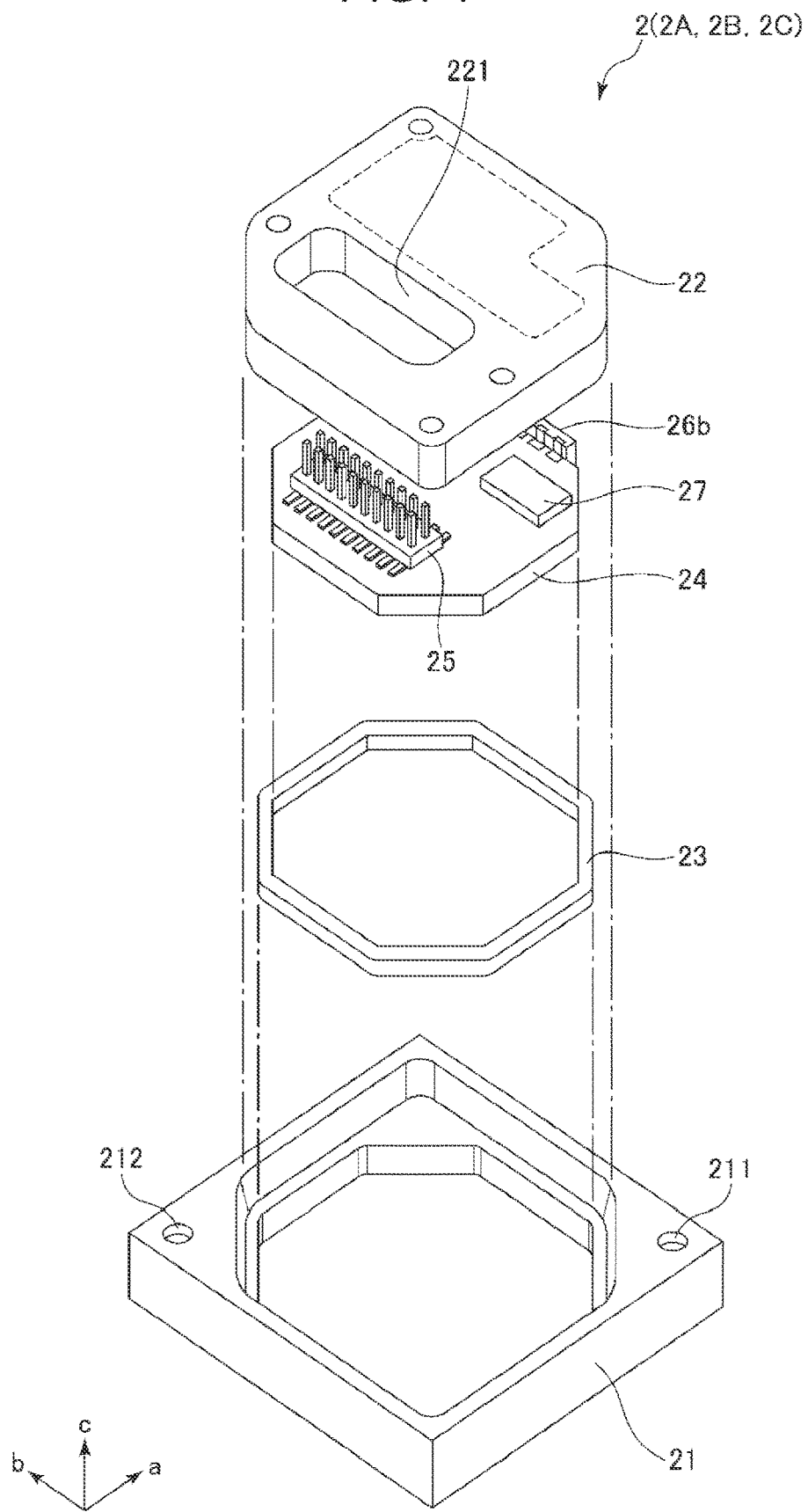
FIG. 4 is an exploded perspective view illustrating a sensor module.
Figure 5:
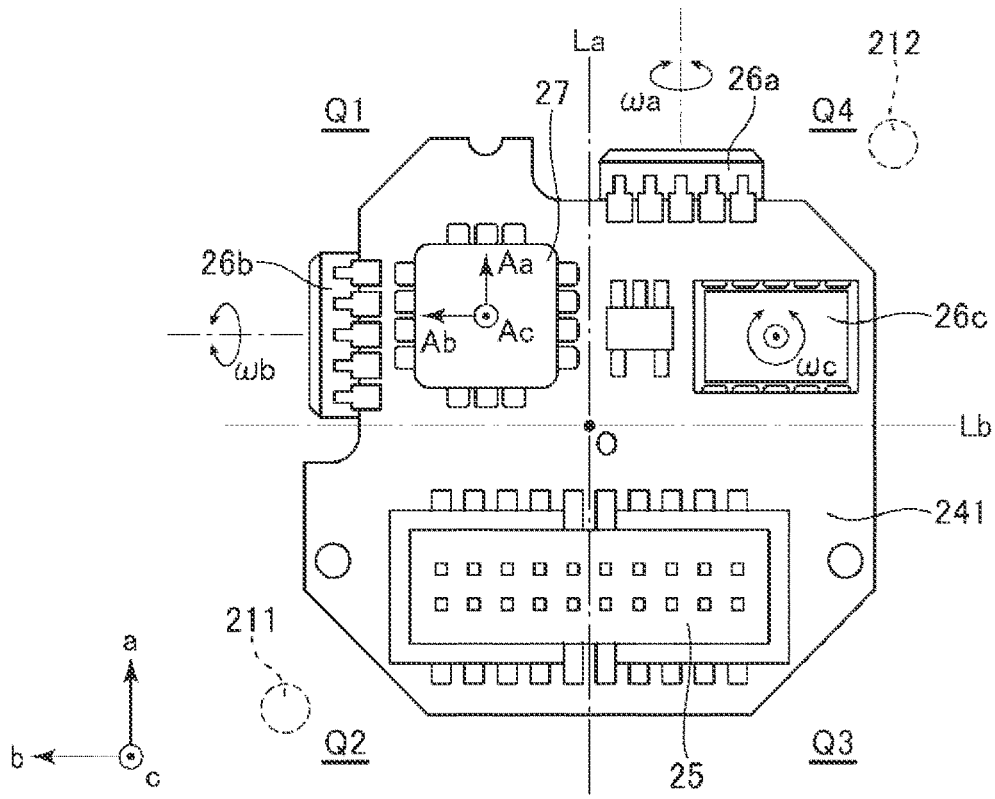
FIG. 5 is a top view illustrating a circuit substrate included in the sensor module.
Figure 6:
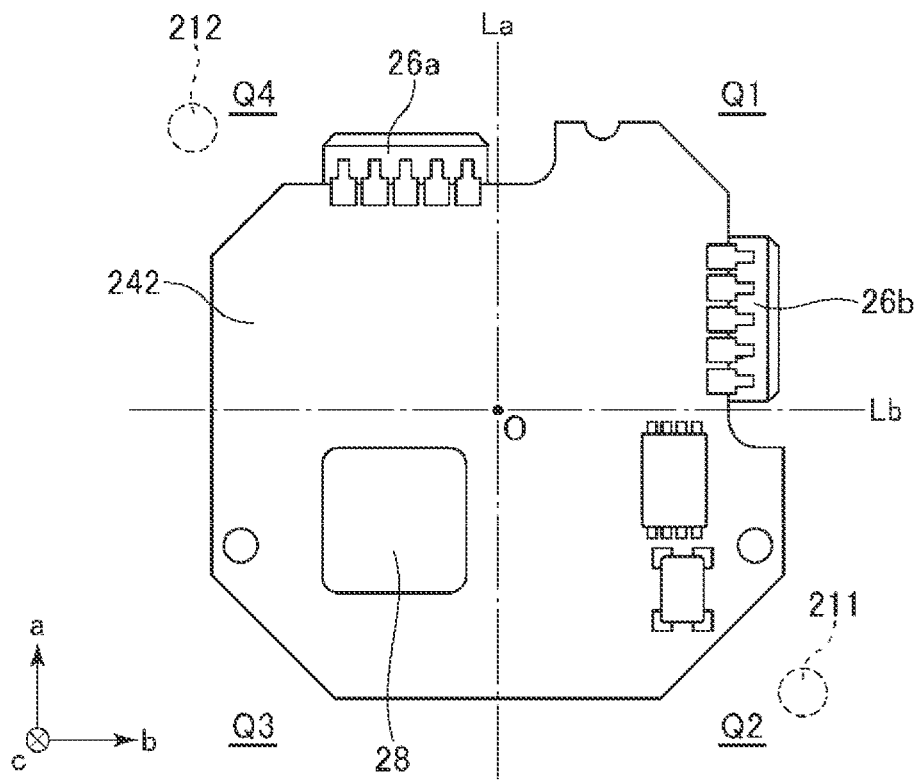
FIG. 6 is a bottom view of the circuit substrate illustrated in FIG. 5.
Figure 7:
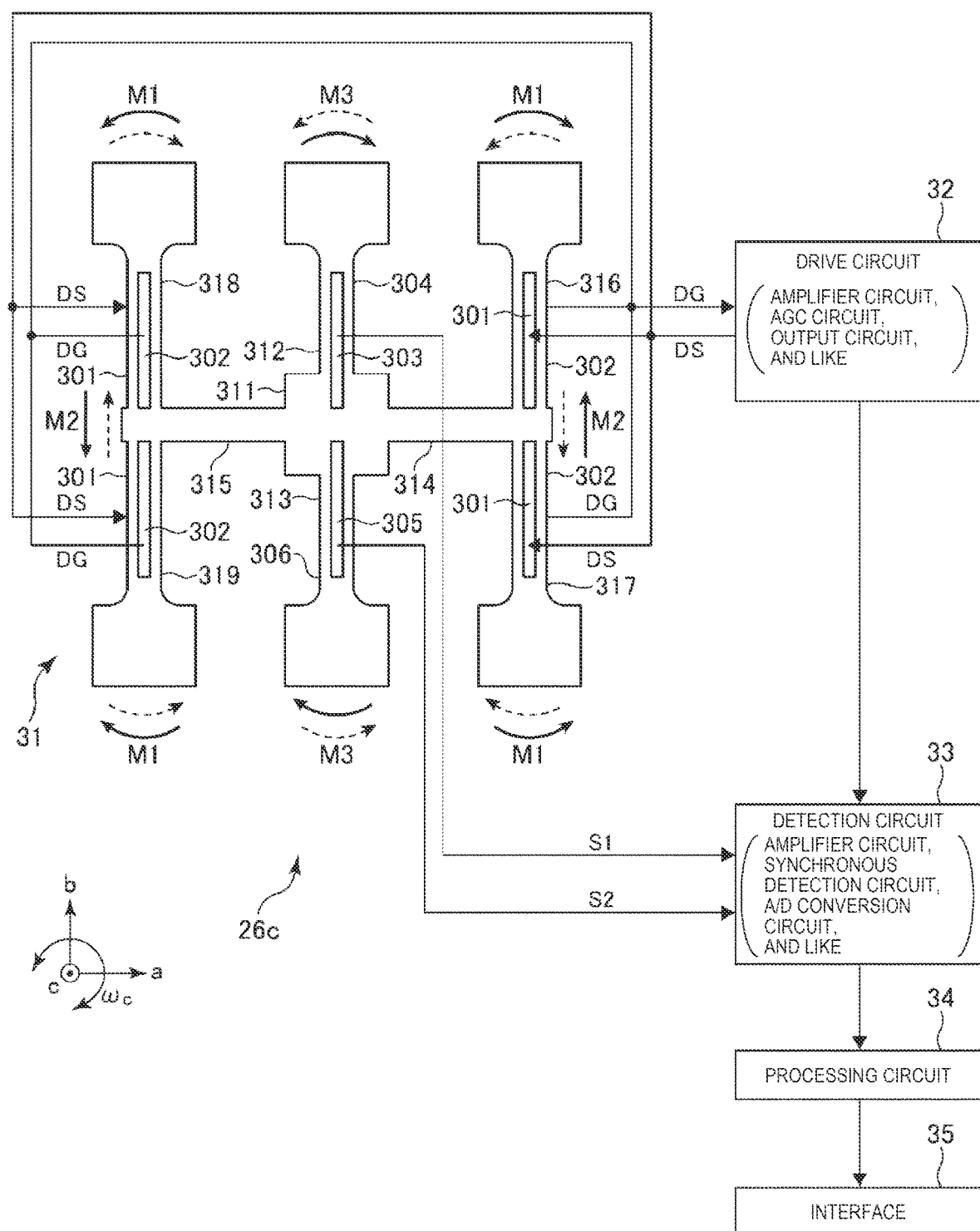
FIG. 7 is a diagram illustrating a configuration of an angular velocity sensor.
Figure 8:
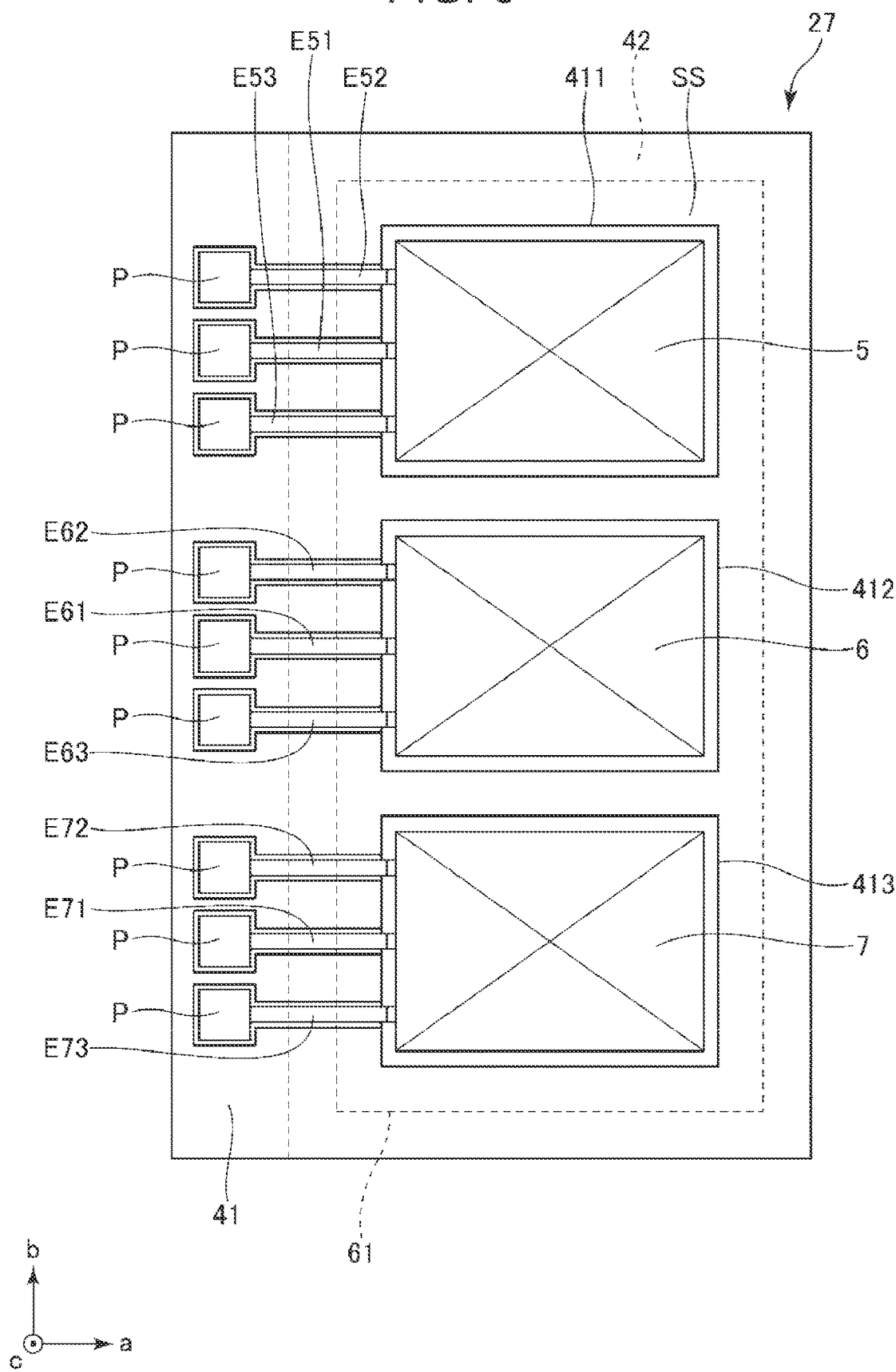
FIG. 8 is a plan view illustrating an acceleration sensor.
Figure 9:
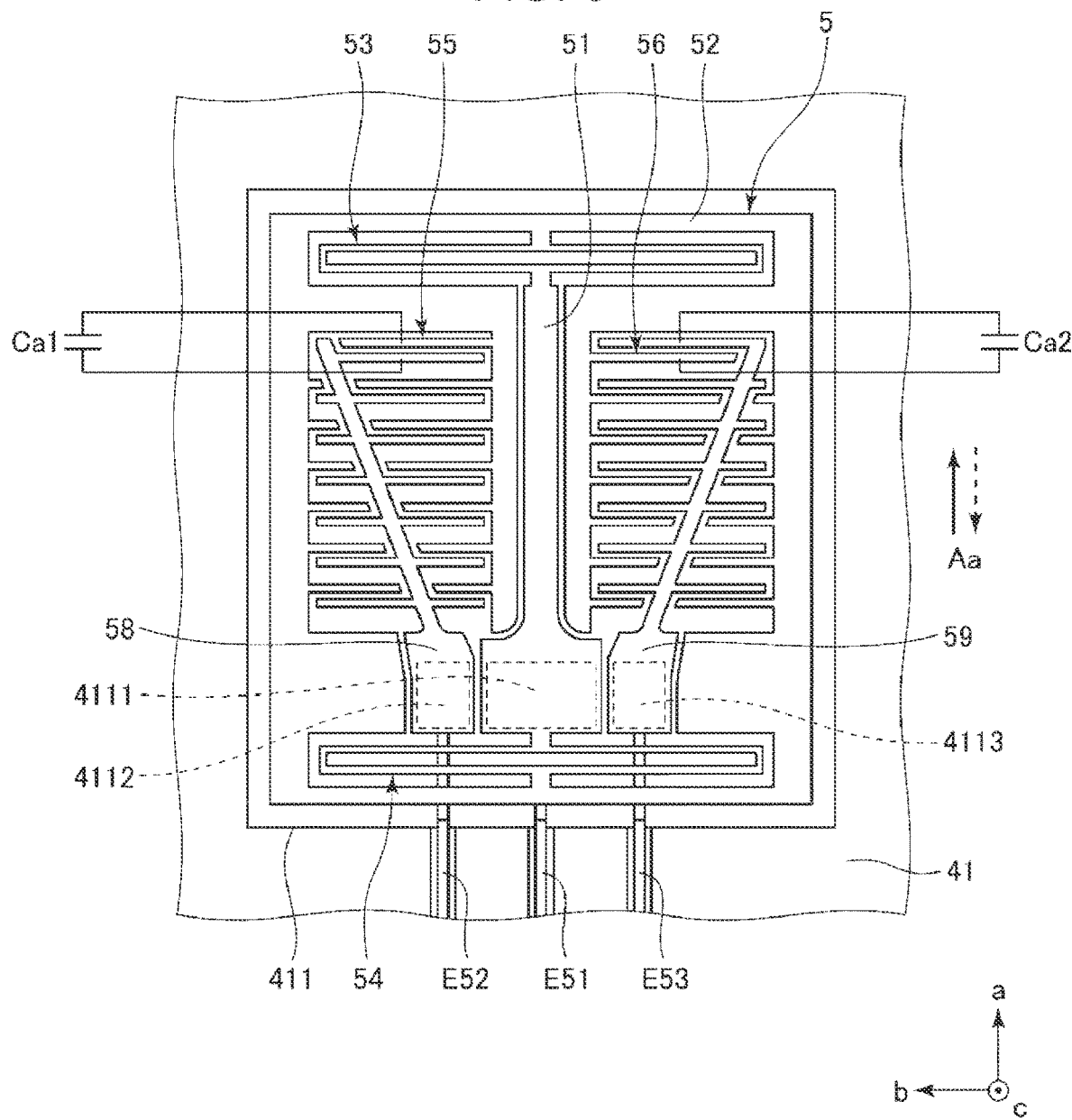
FIG. 9 is a plan view illustrating an a-axis acceleration sensor element.
Figure 10:
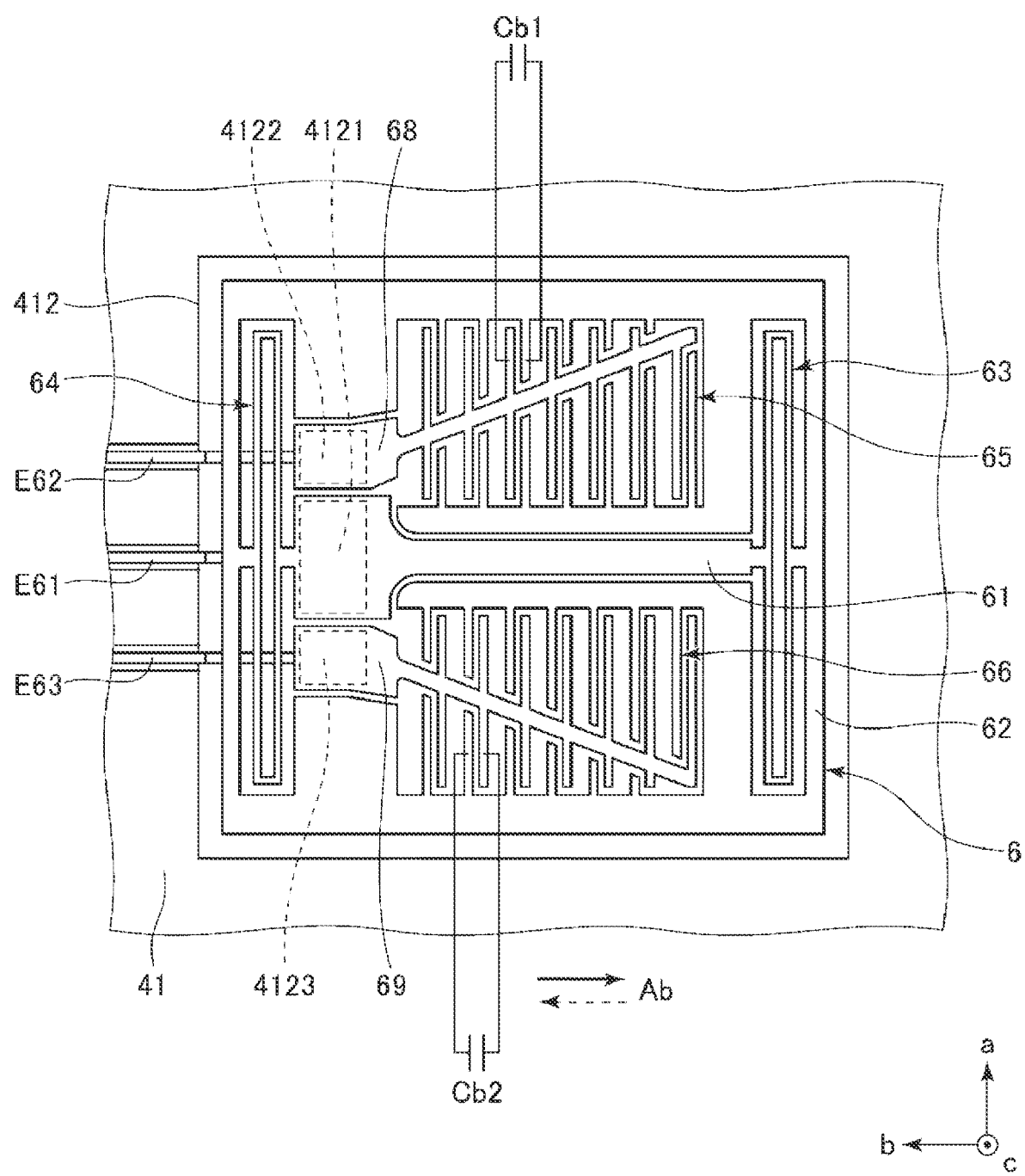
FIG. 10 is a plan view illustrating a b-axis acceleration sensor element.
Figure 11:
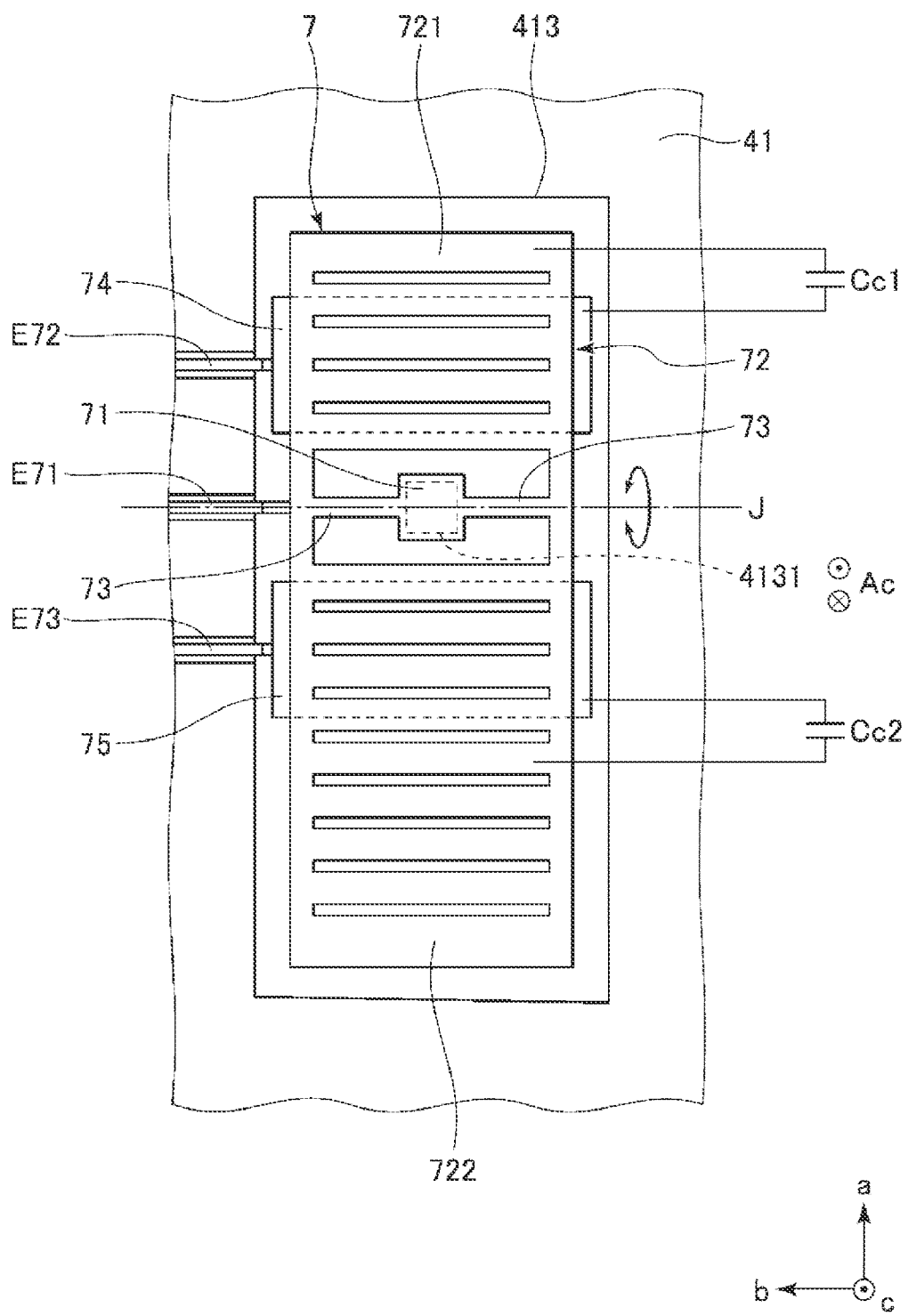
FIG. 11 is a plan view illustrating a c-axis acceleration sensor element.
Figure 12:
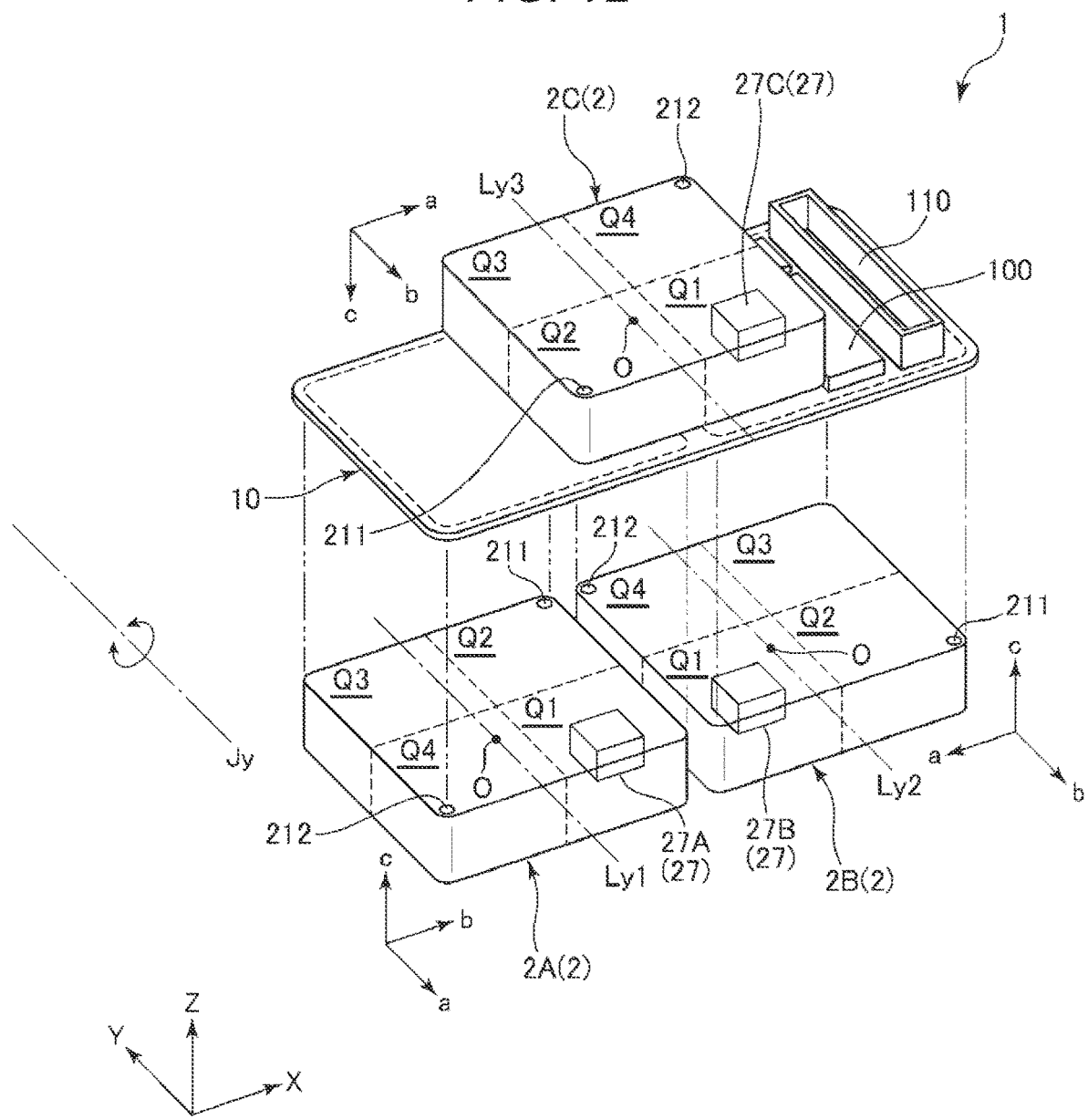
FIG. 12 is an exploded perspective view illustrating an arrangement of three sensor modules different from FIG. 3.

FIG. 1 is a perspective view illustrating a sensor unit according to a first embodiment of the present disclosure. FIG. 2 is a plan view illustrating an inside of the sensor unit illustrated in FIG. 1. FIG. 3 is an exploded perspective view illustrating a substrate and three sensor modules arranged at the substrate. FIG. 4 is an exploded perspective view illustrating a sensor module. FIG. 5 is a top view illustrating a circuit substrate included in the sensor module. FIG. 6 is a bottom view of the circuit substrate illustrated in FIG. 5. FIG. 7 is a diagram illustrating a configuration of an angular velocity sensor. FIG. 8 is a plan view illustrating an acceleration sensor. FIG. 9 is a plan view illustrating an a-axis acceleration sensor element. FIG. 10 is a plan view illustrating a b-axis acceleration sensor element. FIG. 11 is a plan view illustrating a c-axis acceleration sensor element. FIG. 12 is an exploded perspective view illustrating an arrangement of three sensor modules different from FIG. 3.

For convenience of description, each of FIGS. 1 to 3 illustrates three axes, that is, an X-axis, a Y-axis, and a Z-axis which are orthogonal to each other. In addition, a direction along the X-axis is also referred to as an X-axis direction, a direction along the Y-axis is also referred to as a Y-axis direction, and a direction along the Z-axis is also referred to as a Z-axis direction. The arrow side of each axis is also referred to as a "positive side", and the opposite side is also referred to as a "negative side". Further, a positive side in the Z-axis direction is also referred to as "upper" and a negative side in the Z-axis direction is also referred to as "lower". In addition, plan view from the Z-axis direction is also simply referred to as "plan view".

A sensor unit 1 illustrated in FIG. 1 is an inertial measurement apparatus which detects a posture or behavior of a moving object such as an automobile, an agricultural machine, a construction machine, a robot, and a drone, for example. The sensor unit 1 is a composite sensor unit including an angular velocity sensor which measures a triaxial angular velocity and an acceleration sensor which measures triaxial acceleration. Accordingly, the sensor unit 1 has high convenience. As illustrated in FIGS. 1 and 2, such a sensor unit 1 includes a substrate 10, a first sensor module 2A, a second sensor module 2B, and a third sensor module 2C mounted on the substrate 10, and a container 9 which accommodates the substrate 10, the first sensor module 2A, the second sensor module 2B, and the third sensor module 2C.

First, the container 9 will be described. As illustrated in FIGS. 1 and 2, the container 9 has a base 91 having a recess portion 911 which is open at an upper surface and a lid 92 which is fixed to the base 91 so as to close an opening of the recess portion 911. An accommodation space S is formed inside such a container 9, and three sensor modules 2, that is, the first sensor module 2A, the second sensor module 2B, and the third sensor module 2C are accommodated in the accommodation space S in a state of being mounted on the substrate 10. Accordingly, it is possible to protect the first sensor module 2A, the second sensor module 2B, and the third sensor module 2C from dust, dirt, moisture, ultraviolet rays, impact, and the like.

The base 91 and the lid 92 are each made of aluminum (Al). Accordingly, the container 9 is sufficiently hard. Meanwhile, constituent materials of the base 91 and the lid 92 are not particularly limited to aluminum, and for example, metal materials such as aluminum alloy, zinc, and stainless steel, various types of ceramics, various resin materials, and a composite material of a metal material and a resin material can also be used. Further, the base 91 and the lid 92 may be made of different constituent materials.

A connector 93 is attached to a side wall of the base 91. The connector 93 has a function of electrically coupling the inside and the outside of the container 9, and includes a substrate 931 having an interface circuit, as illustrated in FIG. 2. The interface circuit has an interface function between the sensor unit 1 and other sensors or circuit modules.

Next, the substrate 10 will be described. Although not illustrated, the substrate 10 is a circuit substrate at which predetermined circuits and wirings are formed, and is also a support substrate which supports each portion such as the sensor module 2, a control portion 100, a connector 110, and the like. The substrate 10 is fixed to the base 91 by, for example, screwing. Meanwhile, a method of fixing the substrate 10 to the container 9 is not particularly limited. As illustrated in FIGS. 2 and 3, the first sensor module 2A and the second sensor module 2B are arranged side by side along the X-axis direction at a lower surface of the substrate 10, and the third sensor module 2C is disposed at an upper surface so as to overlap with the first sensor module 2A in plan view. Further, the control portion 100 and the connector 110 are arranged at the upper surface of the substrate 10 so as to overlap with the second sensor module 2B in plan view. With this arrangement, spaces at the upper surface and the lower surface of the substrate 10 can be effectively used without waste. Therefore, the substrate 10 can be downsized, and the sensor unit 1 can be downsized accordingly.

A connector (not illustrated) which is coupled to a connector 25 included in the first sensor module 2A and which electrically couples the first sensor module 2A and the control portion 100 is disposed at a portion of the substrate 10 at which the first sensor module 2A is disposed. In addition, a connector (not illustrated) which is coupled to the connector 25 included in the second sensor module 2B and which electrically couples the second sensor module 2B and the control portion 100 is disposed at a portion of the substrate 10 at which the second sensor module 2B is disposed. Further, a connector (not illustrated) which is coupled to the connector 25 included in the third sensor module 2C and which electrically couples the third sensor module 2C and the control portion 100 is disposed at a portion of the substrate 10 at which the third sensor module 2C is disposed.

The control portion 100 controls driving of each unit of the sensor unit 1, particularly the first sensor module 2A, the second sensor module 2B, and the third sensor module 2C. Further, the control portion 100 is electrically coupled to the connector 110, and the connector 110 is electrically coupled to the interface circuit of the substrate 931 via a wiring (not illustrated). The control portion 100 includes a control circuit. The control circuit is, for example, a Micro Controller Unit (MCU), and includes a storage portion including a non-volatile memory, an A/D converter, and the like and controls each portion of the sensor unit 1.

Next, the first sensor module 2A, the second sensor module 2B, and the third sensor module 2C will be described. Since the first sensor module 2A, the second sensor module 2B, and the third sensor module 2C have the same configuration as each other, the first sensor module 2A, the second sensor module 2B, and the third sensor module 2C will be collectively described as a "sensor module 2" below. Meanwhile, the present embodiment is not limited to this, and at least one of the first sensor module 2A, the second sensor module 2B, and the third sensor module 2C may have a configuration different from the other sensor modules.

In the following description of the sensor module 2, FIGS. 4 to 11 illustrate three axes of a-axis, b-axis, and c-axis which are orthogonal to each other. In addition, a direction along the a-axis is also referred to as an a-axis direction, a direction along the b-axis is also referred to as a b-axis direction, and a direction along the c-axis is also referred to as a c-axis direction. The arrow side of each axis is also referred to as a "positive side", and the opposite side is also referred to as a "negative side". The a-axis, the b-axis, and the c-axis are axes set for the sensor module 2 and are different from the X-axis, the Y-axis, and the Z-axis which are axes set for the sensor unit 1.

As illustrated in FIG. 4, the sensor module 2 is configured so that an outer case 21 and an inner case 22 are included, and the inner case 22 is inserted into the outer case 21 and the outer case 21 and the inner case 22 are joined by a joining member 23. An outer shape of the sensor module 2, that is, the outer case 21 is an approximately rectangular shape, particularly a square shape in plan view from the c-axis direction. Further, a screw hole 211 is provided in one of a pair of corner portions located diagonally of the outer case 21, and a screw hole 212 is provided in the other. The sensor module 2 is fixed by being screwed to the substrate 10 by using the screw holes 211 and 212. Meanwhile, the outer shape of the sensor module 2 or the arrangement and number of the screw holes 211 and 212 are not particularly limited. Further, a method of fixing the sensor module 2 to the substrate 10 is not particularly limited.

The sensor module 2 has a circuit substrate 24 accommodated between the outer case 21 and the inner case 22. The circuit substrate 24 is supported by the inner case 22. As illustrated in FIGS. 5 and 6, the connector 25 which electrically couples to the outside, an angular velocity sensor 26a which measures an angular velocity ωa around the a-axis, an angular velocity sensor 26b which measures an angular velocity ωb around the b-axis, an angular velocity sensor 26c which measures an angular velocity ωc around the c-axis, an acceleration sensor 27 which measures acceleration in each axis direction of the a-axis, b-axis, and c-axis, and a control IC 28 are mounted at the circuit substrate 24. The angular velocity sensor 26a, the angular velocity sensor 26b, the angular velocity sensor 26c, and the acceleration sensor 27 are electrically coupled to the control IC 28, and the control IC 28 is electrically coupled to the connector 25. The connector 25 is exposed from an opening 221 provided in the inner case 22, and can be electrically coupled from the outside of the outer case 21.

The control IC 28 is a Micro Controller Unit (MCU), and controls each portion of the sensor module 2. A storage portion (not illustrated) in the control IC 28 stores a program which defines an order and a content for measuring acceleration and an angular velocity, a program which digitizes measured data and incorporates the data into packet data, or accompanying data. A plurality of electronic components are mounted at the circuit substrate 24.

As illustrated in FIG. 7, the angular velocity sensor 26c has an oscillator 31, a drive circuit 32, a detection circuit 33, a processing circuit 34, and an interface 35.

The drive circuit 32 has an amplifier circuit for amplifying a signal by receiving a feedback signal DG from the oscillator 31, an AGC circuit for performing automatic gain control, an output circuit for outputting a drive signal DS to the oscillator 31, or the like. The AGC circuit variably and automatically adjusts a gain so that an amplitude of the feedback signal DG from the oscillator 31 becomes constant. The output circuit also outputs the drive signal DS in a rectangular-wave shape to the oscillator 31.

The detection circuit 33 has an amplifier circuit, a synchronous detection circuit, an A/D conversion circuit, and the like. For example, the amplifier circuit receives detection signals S1 and S2 from the oscillator 31 and performs charge-voltage conversion or signal amplification on the detection signals S1 and S2 which are differential signals. Further, for example, the synchronous detection circuit uses a synchronization signal from the drive circuit 32 to perform synchronous detection for extracting a desired wave. The A/D conversion circuit converts an analog detection signal after the synchronous detection into digital detection data and outputs the detection data to the processing circuit 34.

The processing circuit 34 performs various processes such as zero point correction, sensitivity adjustment, a filter process, and temperature correction on the detection data, and outputs the processed detection data to the interface 35.

The oscillator 31 is a crystal oscillator, and is formed by patterning a crystal substrate into a predetermined outer shape. In this manner, by using the crystal oscillator as the oscillator 31, it is possible to exhibit excellent temperature characteristics as compared when using an MEMS silicon oscillator, for example. Therefore, the angular velocity sensor 26c can detect the angular velocity ωc with higher accuracy.

Such an oscillator 31 includes a base portion 311 located in a central portion of the oscillator 31, a pair of detection arms 312 and 313 extending from the base portion 311 toward both sides of the b-axis direction, a pair of coupling arms 314 and 315 extending from the base portion 311 toward both sides of the a-axis direction, a pair of drive arms 316 and 317 extending from a tip portion of the coupling arm 314 toward both sides of the b-axis direction, and a pair of drive arms 318 and 319 extending from a tip portion of the coupling arm 315 toward both sides of the b-axis direction.

Further, drive signal electrodes 301 are disposed at an upper surface and a lower surface of the drive arms 316 and 317 and both side surfaces of the drive arms 318 and 319, and drive ground electrodes 302 are disposed at both side surfaces of the drive arms 316 and 317 and an upper surface and a lower surface of the drive arms 318 and 319. The drive signal DS from the drive circuit 32 is supplied to the drive signal electrode 301, and the feedback signal DG from the drive ground electrode 302 is input to the drive circuit 32.

First detection signal electrodes 303 are disposed at upper and lower surfaces of the detection arm 312, and first detection ground electrodes 304 are disposed at both side surfaces of the detection arm 312. Second detection signal electrodes 305 are disposed at upper and lower surfaces of the detection arm 313, and second detection ground electrodes 306 are disposed at both side surfaces of the detection arm 313. The detection signals S1 and S2 from the first and second detection signal electrodes 303 and 305 are input to the detection circuit 33.

Such an angular velocity sensor 26c detects the angular velocity ωc around the c-axis in the following manner. First, when the drive signal DS is applied to the drive signal electrode 301 by the drive circuit 32, the drive arms 316, 317, 318, and 319 flexibly vibrate as indicated by an arrow M1 in FIG. 7 due to an inverse piezoelectric effect. Hereinafter, this drive mode is referred to as a drive vibration mode. At this time, since the drive arms 316 and 317 and the drive arms 318 and 319 vibrate in opposite phases, these vibrations are canceled and the detection arms 312 and 313 do not substantially vibrate.

When the angular velocity ωe is applied to the oscillator 31 in s state of being driven in the drive vibration mode, a detection vibration mode is newly excited. In the detection vibration mode, Coriolis force acts on the drive arms 316, 317, 318, and 319 to excite vibration in a direction indicated by the arrow M2, and in response to this vibration, in the detection arms 312 and 313, detection vibration occurs due to bending vibration in a direction indicated by the arrow M3. Charge signals generated in the detection arms 312 and 313 by such a detection vibration mode are input to the detection circuit 33 as the detection signals S1 and S2, and the angular velocity ωc around the c-axis is detected.

Hereinbefore, the angular velocity sensor 26c is described. A configuration of the angular velocity sensor 26c is not particularly limited as long as the angular velocity ωc can be detected. For example, in the present embodiment, an oscillator having a double T-type structure is used as the oscillator 31, but the present embodiment is not limited to this, and an oscillator such as a tuning fork type or an H type may be used. Further, the oscillator 31 may be configured by an MEMS silicon oscillator instead of the crystal oscillator.

The angular velocity sensor 26a has the same configuration as the angular velocity sensor 26c described above, and is mounted on the circuit substrate 24 in a state of being rotated by 90° around the b-axis based on the angular velocity sensor 26c. Accordingly, a detection axis of the angular velocity sensor 26a can be along the a-axis, and the angular velocity sensor 26a can detect the angular velocity ωa around the a-axis. In the same manner, the angular velocity sensor 26b has the same configuration as the angular velocity sensor 26c described above, and is mounted on the circuit substrate 24 in a state of being rotated by 90° around the a-axis based on the angular velocity sensor 26c. Accordingly, a detection axis of the angular velocity sensor 26b can be along the b-axis, and the angular velocity sensor 26b can detect the angular velocity ωb around the b-axis.

As illustrated in FIG. 8, the acceleration sensor 27 includes a substrate 41, an a-axis acceleration sensor element 5, a b-axis acceleration sensor element 6, and a c-axis acceleration sensor element 7 arranged at an upper surface of the substrate 41, and a lid 42 joined to the substrate 41 so as to accommodate the a-axis acceleration sensor element 5, the b-axis acceleration sensor element 6, and the c-axis acceleration sensor element 7. In the acceleration sensor 27 having such a configuration, the a-axis acceleration sensor element 5 detects an acceleration Aa in the a-axis direction, the b-axis acceleration sensor element 6 detects an acceleration Ab in the b-axis direction, and the c-axis acceleration sensor element 7 detects an acceleration Ac in the c-axis direction. In FIG. 8, for convenience of description, the a-axis acceleration sensor element 5, the b-axis acceleration sensor element 6, and the c-axis acceleration sensor element 7 are illustrated in a simplified manner.

The substrate 41 has a plate-like shape and has three recess portions 411, 412, and 413 which are open at the upper surface of the substrate 41. The a-axis acceleration sensor element 5 is disposed so as to overlap with the recess portion 411, the b-axis acceleration sensor element 6 is disposed so as to overlap with the recess portion 412, and the c-axis acceleration sensor element 7 is disposed so as to overlap with the recess portion 413. Each of these recess portions 411, 412, and 413 functions as escape portions which suppress contact between each of the a-axis acceleration sensor element 5, the b-axis acceleration sensor element 6, and the c-axis acceleration sensor element 7 and the substrate 41.

Further, the substrate 41 has a plurality of grooves opened at the upper surface, and wirings E51, E52, E53, E61, E62, E63, E71, E72, and E73 are provided in each of these grooves. The wirings E51, E52, E53, E61, E62, E63, E71, E72, and E73 are arranged inside and outside an accommodating space SS, and among the wirings E51, E52, E53, E61, E62, E63, E71, E72, and E73, the wirings E51, E52, and E53 are electrically coupled to the a-axis acceleration sensor element 5, the wirings E61, E62, and E63 are electrically coupled to the b-axis acceleration sensor element 6, and the wirings E71, E72, and E73 are electrically coupled to the c-axis acceleration sensor element 7. Further, one end portions of the wirings E51, E52, E53, E61, E62, E63, E71, E72, and E73 are exposed to the outside of a lid 42 and function as electrode pads P which electrically couples to the outside.

The substrate 41 is made of, for example, a glass material containing alkali metal ions such as sodium ions, specifically, borosilicate glass such as Tempax glass and Pyrex glass (all are registered trademarks). Meanwhile, the constituent material of the substrate 41 is not particularly limited, and a silicon substrate, a ceramics substrate, or the like may be used.

The lid 42 has a recess portion 421 which is open at a lower surface. The lid 42 accommodates each of the a-axis acceleration sensor element 5, the b-axis acceleration sensor element 6, and the c-axis acceleration sensor element 7 in the recess portion 421 and is joined to the upper surface of the substrate 41. That is, the lid 42 and the substrate 41 form the accommodation space SS which hermetically accommodates each of the a-axis acceleration sensor element 5, the b-axis acceleration sensor element 6, and the c-axis acceleration sensor element 7.

The accommodating space SS is filled with an inert gas such as nitrogen, helium, or argon, and is preferably used at a temperature of, for example, approximately −40° C. to +85° C. and substantially at atmospheric pressure. By setting the accommodation space SS to the atmospheric pressure, a viscous resistance increases and a damping effect is exhibited, and vibrations of the a-axis acceleration sensor element 5, the b-axis acceleration sensor element 6, and the c-axis acceleration sensor element 7 can be quickly converged. Therefore, the detection accuracy of the acceleration sensor 27 is improved.

The lid 42 as described above is made of silicon. Meanwhile, the constituent material of the lid 42 is not particularly limited, and for example, a glass substrate or a ceramic substrate may be used. A method of joining the substrate 41 and the lid 42 is not particularly limited and may be appropriately selected depending on the materials of the substrate 41 and the lid 42. In the present embodiment, the lid 42 is joined via a joining member 43 formed over an entire lower surface of the lid 42. As the joining member 43, for example, a glass frit material which is a low melting point glass can be used.

Next, the a-axis acceleration sensor element 5, the b-axis acceleration sensor element 6, and the c-axis acceleration sensor element 7 will be described with reference to FIGS. 9 to 11. In each of the a-axis acceleration sensor element 5, the b-axis acceleration sensor element 6, and the c-axis acceleration sensor element 7, for example, a silicon substrate doped with impurities such as phosphorus (P), boron (B), and arsenic (As) is anodically joined to the upper surface of the substrate 41, and this silicon substrate is collectively formed by patterning by a Bosch process which is a deep groove etching technology.

The a-axis acceleration sensor element 5 can detect the acceleration Aa in the a-axis direction. As illustrated in FIG. 9, such an a-axis acceleration sensor element 5 includes a fixing portion 51 fixed to a mount 4111 protruding from a bottom surface of the recess portion 411, a movable body 52 which is displaceable in the a-axis direction based on the fixing portion 51, springs 53 and 54 coupling the fixing portion 51 and the movable body 52, a first movable electrode 55 and a second movable electrode 56 included in the movable body 52, a first fixing electrode 58 which is fixed to a mount 4112 protruding from the bottom surface of the recess portion 411 and which faces the first movable electrode 55, and a second fixing electrode 59 which is fixed to a mount 4113 protruding from the bottom surface of the recess portion 411 and which faces the second movable electrode 56.

Further, the first and second movable electrodes 55 and 56 are electrically coupled to the wiring E51 by the fixing portion 51, the first fixing electrode 58 is electrically coupled to the wiring E52, and the second fixing electrode 59 is electrically coupled to the wiring E53. A drive voltage is applied to the first and second movable electrodes 55 and 56. On the other hand, a fixing voltage AGND (an analog ground) is applied to the first and second fixing electrodes 58 and 59, and the first and second fixing electrodes 58 and 59 are coupled to a charge amplifier via the electrode pad P. Therefore, an electrostatic capacitance Ca1 is formed between the first movable electrode 55 and the first fixing electrode 58, and an electrostatic capacitance Ca2 is formed between the second movable electrode 56 and the second fixing electrode 59.

When the acceleration Aa is applied to the a-axis acceleration sensor element 5 in a state in which the electrostatic capacitances Ca1 and Ca2 are formed, the movable body 52 is displaced in the a-axis direction, and the electrostatic capacitances Ca1 and Ca2 are accordingly changed in opposite phases to each other. In addition, based on changes in the electrostatic capacitances Ca1 and Ca2, the amount of charge induced between the first movable electrode 55 and the first fixing electrode 58 and between the second movable electrode 56 and the second fixing electrode 59 is also changed. When a difference in the amount of charge induced between the first movable electrode 55 and the first fixing electrode 58 and between the second movable electrode 56 and the second fixing electrode 59 occurs, the difference is output as a voltage value of the charge amplifier. Therefore, it is possible to obtain the acceleration Aa received by the a-axis acceleration sensor element 5 based on the voltage value output from the charge amplifier.

The b-axis acceleration sensor element 6 can detect the acceleration Ab in the b-axis direction. Such a b-axis acceleration sensor element 6 can be configured, for example, as illustrated in FIG. 10, by rotating the a-axis acceleration sensor element 5 described above by 90° around the c-axis. That is, the b-axis acceleration sensor element 6 includes a fixing portion 61 fixed to a mount 4121 protruding from a bottom surface of the recess portion 412, a movable body 62 which is displaceable in the b-axis direction based on the fixing portion 61, springs 63 and 64 which couple the fixing portion 61 and the movable body 62, a first movable electrode 65 and a second movable electrode 66 included in the movable body 62, a first fixing electrode 68 which is fixed to a mount 4122 protruding from the bottom surface of the recess portion 412 and which faces the first movable electrode 65, and a second fixing electrode 69 which is fixed to the mount 4123 protruding from the bottom surface of the recess portion 412 and which faces the second movable electrode 66.

The first and second movable electrodes 65 and 66 are electrically coupled to the wiring E61 by the fixing portion 61, the first fixing electrode 68 is electrically coupled to the wiring E62, and the second fixing electrode 69 is electrically coupled to the wiring E63. A drive voltage is applied to the first and second movable electrodes 65 and 66. On the other hand, the fixing voltage AGND (an analog ground) is applied to the first and second fixing electrodes 68 and 69, and the first and second fixing electrodes 68 and 69 are coupled to a charge amplifier via the electrode pad P. Therefore, an electrostatic capacitance Cb1 is formed between the first movable electrode 65 and the first fixing electrode 68, and an electrostatic capacitance Cb2 is formed between the second movable electrode 66 and the second fixing electrode 69.

When the acceleration Ab is applied to the b-axis acceleration sensor element 6 in a state in which the electrostatic capacitances Cb1 and Cb2 are formed, the movable body 62 is displaced in the b-axis direction, and the electrostatic capacitances Cb1 and Cb2 are accordingly changed in opposite phases to each other. In addition, based on changes in the electrostatic capacitances Cb1 and Cb2, the amount of charge induced between the first movable electrode 65 and the first fixing electrode 68 and between the second movable electrode 66 and the second fixing electrode 69 is also changed. When a difference in the amount of charge induced between the first movable electrode 65 and the first fixing electrode 68 and between the second movable electrode 66 and the second fixing electrode 69 occurs, the difference is output as a voltage value of the charge amplifier. Therefore, it is possible to obtain the acceleration Ab received by the b-axis acceleration sensor element 6 based on the voltage value output from the charge amplifier.

The c-axis acceleration sensor element 7 can detect the acceleration Ac in the c-axis direction. As illustrated in FIG. 11, for example, the c-axis acceleration sensor element 7 described above includes a fixing portion 71 fixed to a mount 4131 protruding from a bottom surface of the recess portion 413, and a movable body 72 which is coupled to the fixing portion 71 via a beam 73 and is swingable around a swing axis J along the a-axis based on the fixing portion 71. In addition, the movable body 72 includes a first movable portion 721 located at one side of the swing axis J and a second movable portion 722 located at the other side. Further, the first movable portion 721 and the second movable portion 722 have different rotational moments around the swing axis J from each other. A first fixing electrode 74 facing the first movable portion 721 and a second fixing electrode 75 facing the second movable portion 722 are arranged at the bottom surface of the recess portion 413.

The movable body 72 is electrically coupled to the wiring E71 by the fixing portion 71, and the first fixing electrode 74 is electrically coupled to the wiring E72 and the second fixing electrode 75 is electrically coupled to the wiring E73. A drive voltage is applied to the movable body 72 via the electrode pad P. On the other hand, the fixing voltage AGND (an analog ground) is applied to the first and second fixing electrodes 74 and 75, and the first and second fixing electrodes 74 and 75 are coupled to a charge amplifier via the electrode pad P. Therefore, an electrostatic capacitance Cc1 is formed between the first movable portion 721 and the first fixing electrode 74, and an electrostatic capacitance Cc2 is formed between the second movable portion 722 and the second fixing electrode 75.

When the acceleration Ac is applied to the c-axis acceleration sensor element 7 in a state in which the electrostatic capacitances Cc1 and Cc2 are formed, the movable body 72 is displaced around the swing axis J, and the electrostatic capacitances Cc1 and Cc2 are accordingly changed in opposite phases to each other. Therefore, based on changes in the electrostatic capacitances Cc1 and Cc2, the amount of charge induced between the first movable portion 721 and the first fixing electrode 74 and between the second movable portion 722 and the second fixing electrode 75 is also changed. When a difference in the amount of charge induced between the first movable portion 721 and the first fixing electrode 74 and between the second movable portion 722 and the second fixing electrode 75 occurs, the difference is output as a voltage value of the charge amplifier. Therefore, it is possible to obtain the acceleration Ac received by the c-axis acceleration sensor element 7 based on the voltage value output from the charge amplifier.

Hereinbefore, the acceleration sensor 27 is described. The configuration of the acceleration sensor 27 is not particularly limited as long as the acceleration sensor 27 can detect the accelerations Aa, Ab, and Ac. For example, in the present embodiment, the MEMS silicon elements are used as the a-axis acceleration sensor element 5, the b-axis acceleration sensor element 6, and the c-axis acceleration sensor element 7, but the present embodiment is not limited to this, and for example, a crystal oscillator may be used. Further, an acceleration sensor which detects the acceleration Aa, an acceleration sensor which detects the acceleration Ab, and an acceleration sensor which detects the acceleration Ac may be separately configured.

Next, returning to FIGS. 5 and 6, arrangement of the connector 25, the angular velocity sensor 26a, the angular velocity sensor 26b, the angular velocity sensor 26c, the acceleration sensor 27 and the control IC 28 over the circuit substrate 24 and arrangement of the screw holes 211 and 212 will be described. In the following, in plan view from the c-axis direction, four quadrants to be divided by a virtual line La which intersects with a center O of the sensor module 2 and extends in the a-axis direction, and a virtual line Lb which intersects with the center O of the sensor module 2 and extends in the b-axis direction are referred to as a first quadrant Q1, a second quadrant Q2, a third quadrant Q3, and a fourth quadrant Q4. The first quadrant Q1 is located at a positive side in the a-axis direction and a positive side in the b-axis direction based on the center O. The second quadrant Q2 is located at a negative side in the a-axis direction and the positive side in the b-axis direction based on the center O. The third quadrant Q3 is located at the negative side in the a-axis direction and a negative side in the b-axis direction based on the center O. The fourth quadrant Q4 is located at the positive side in the a-axis direction and the negative side in the b-axis direction based on the center O.

The connector 25 is disposed at an upper surface 241 of the circuit substrate 24, and is located in the second quadrant Q2 and the third quadrant Q3. The angular velocity sensor 26a is disposed at a side surface of the circuit substrate 24 and is located in the fourth quadrant Q4. The angular velocity sensor 26b is disposed at the side surface of the circuit substrate 24 and is located in the first quadrant Q1. The angular velocity sensor 26c is disposed at the upper surface 241 of the circuit substrate 24 and is located in the fourth quadrant Q4. The acceleration sensor 27 is disposed at the upper surface 241 of the circuit substrate 24 and is located in the first quadrant Q1. The control IC 28 is disposed at a lower surface 242 of the circuit substrate 24 and is located in the third quadrant Q3. The screw hole 211 is located in the second quadrant Q2. The screw hole 212 is located in the fourth quadrant Q4.

Hereinbefore, the first sensor module 2A, the second sensor module 2B, and the third sensor module 2C are collectively described as the "sensor module 2". Next, returning to FIG. 3, arrangement of the first sensor module 2A, the second sensor module 2B, and the third sensor module 2C will be described. In the following, for convenience of description, the acceleration sensor 27 included in the first sensor module 2A is also referred to as a "first acceleration sensor 27A", and the acceleration sensor 27 included in the second sensor module 2B is also referred to as a "second acceleration sensor 27B", and the acceleration sensor 27 included in the third sensor module 2C is also referred to as a "third acceleration sensor 27C".

As illustrated in FIG. 3, the first sensor module 2A and the second sensor module 2B are arranged at the lower surface of the substrate 10. Further, the first sensor module 2A and the second sensor module 2B are arranged side by side in the X-axis direction so as to be adjacent to each other. The first sensor module 2A is located at the negative side of the second sensor module 2B in the X-axis direction. Further, the first sensor module 2A and the second sensor module 2B are arranged close to each other, and there is a gap between the first sensor module 2A and the second sensor module 2B, but no other member is interposed.

The first sensor module 2A and the second sensor module 2B are preferably arranged as close to each other as possible as long as the first sensor module 2A and the second sensor module 2B are not in contact with each other. By arranging the first sensor module 2A and the second sensor module 2B in a non-contact manner, that is, by arranging the first sensor module 2A and the second sensor module 2B through a gap, it is possible to prevent distortion of the outer case 21 due to contact. Therefore, it is possible to suppress an unintended unnecessary stress from being transmitted to various sensors. In addition, by arranging the first sensor module 2A and the second sensor module 2B as close to each other as possible, that is, by arranging the first sensor module 2A and the second sensor module 2B through a very small gap, it is possible to further reduce a deviation (a difference) between inertia received by the first sensor module 2A and inertia received by the second sensor module 2B. A separation distance between the first sensor module 2A and the second sensor module 2B is not particularly limited, but is, for example, preferably equal to or less than 1 mm, more preferably equal to or more than 5 μm or equal to or less than 0.1 mm.

In addition, the first sensor module 2A is disposed so that the a-axis coincides with the Y-axis, the b-axis coincides with the X-axis, and the c-axis coincides with the Z-axis, and a positive side of the a-axis direction faces a negative side of the Y-axis direction, a positive side of the b-axis direction faces a positive side of the X-axis direction, and a positive side of the c-axis direction faces a positive side of the Z-axis direction. On the other hand, the second sensor module 2B is disposed so that the a-axis coincides with the X-axis, the b-axis coincides with the Y-axis, and the c-axis coincides with the Z-axis, and the positive side of the a-axis direction faces a negative side of the X-axis direction, the positive side of the b-axis direction faces the negative side of the Y-axis direction, and the positive side of the c-axis direction faces the positive side of the Z-axis direction. That is, the second sensor module 2B has a posture rotated by 90° around the Z-axis based on the first sensor module 2A.

With this arrangement, the first acceleration sensor 27A is eccentrically disposed at the second sensor module 2B side in the first sensor module 2A, and the second acceleration sensor 27B is eccentrically disposed at the first sensor module 2A side in the second sensor module 2B. Specifically, the first acceleration sensor 27A is located closer to the second sensor module 2B side, that is, on the positive side of the X-axis direction, than a virtual line Ly1 which intersects with the center O of the first sensor module 2A and extends in a direction along the Y-axis, and the second acceleration sensor 27B is located closer to the first sensor module 2A side, that is, on the negative side of the X-axis direction, than a virtual line Ly2 which intersects with the center O of the second sensor module 2B and extends in the direction along the Y-axis. Therefore, the first acceleration sensor 27A and the second acceleration sensor 27B can be arranged close to each other. Accordingly, it is possible to reduce a difference in acceleration received by the first acceleration sensor 27A and the second acceleration sensor 27B.

In particular, in the present embodiment, the first quadrant Q1 of the first sensor module 2A in which the first acceleration sensor 27A is located and the first quadrant Q1 of the second sensor module 2B in which the second acceleration sensor 27B is located are arranged side by side in the X-axis direction. Therefore, the first acceleration sensor 27A and the second acceleration sensor 27B can be arranged closer to each other. Accordingly, it is possible to further reduce the difference in acceleration received by the first acceleration sensor 27A and the second acceleration sensor 27B.

Further, with this arrangement, the screw hole 211 of the first sensor module 2A and the screw hole 212 of the second sensor module 2B, the screw hole 212 of the first sensor module 2A, and the screw hole 211 of the second sensor module 2B are arranged in a well-balanced manner so as to be located at each corner portion of a virtual isosceles triangle. Therefore, the first sensor module 2A and the second sensor module 2B can be fixed to the substrate 10 in a well-balanced manner. Therefore, a stress is unlikely to occur in the first sensor module 2A and the second sensor module 2B. In the first sensor module 2A, at least one of the screw holes 211 and 212 may not be screwed. In the same manner, in the second sensor module 2B, at least one of the screw holes 211 and 212 may not be screwed.

In addition, the third sensor module 2C is disposed at the upper surface of the substrate 10, that is, a surface opposite to the first and second sensor modules 2A and 2B. The third sensor module 2C is disposed side by side with the first sensor module 2A in the Z-axis direction. That is, the third sensor module 2C is disposed to face the first sensor module 2A via the substrate 10, and overlaps with the first sensor module 2A in plan view from the Z-axis direction. In particular, in the present embodiment, the centers O of the third sensor module 2C and the first sensor module 2A overlap with each other.

The third sensor module 2C is disposed so that the a-axis coincides with the X-axis, the b-axis coincides with the Y-axis, and the c-axis coincides with the Z-axis, and the positive side of the a-axis direction faces the positive side of the X-axis direction, the positive side of the b-axis direction faces the negative side of the Y-axis direction, and the positive side of the c-axis direction faces a negative side of the Z-axis direction. That is, the third sensor module 2C has a posture rotated by 180° around the X-axis based on the first sensor module 2A, and further rotated by 90° around the Z-axis.

With this arrangement, the third acceleration sensor 27C is eccentrically disposed at the second sensor module 2B side in the third sensor module 2C. Specifically, the third acceleration sensor 27C is located closer to the second sensor module 2B side, that is, on the positive side of the X-axis direction, than a virtual line Ly3 which intersects with the center O of the third sensor module 2C and extends in the direction along the Y-axis. Therefore, the third acceleration sensor 27C can be located close to the first acceleration sensor 27A and the second acceleration sensor 27B. Accordingly, it is possible to reduce a difference in acceleration received by the first acceleration sensor 27A, the second acceleration sensor 27B, and the third acceleration sensor 27C.

In the present embodiment, the first quadrant Q1 of the third sensor module 2C in which the third acceleration sensor 27C is located and the first quadrant Q1 of the first sensor module 2A in which the first acceleration sensor 27A is located are arranged side by side in the Z-axis direction. In particular, at least a part of the third acceleration sensor 27C overlaps with the first acceleration sensor 27A in plan view. Therefore, the third acceleration sensor 27C and the first acceleration sensor 27A can be arranged closer to each other. Accordingly, it is possible to further reduce the difference in acceleration received by the first acceleration sensor 27A, the second acceleration sensor 27B, and the third acceleration sensor 27C.

Further, according to this arrangement, the screw hole 212 of the third sensor module 2C overlaps with the screw hole 211 of the first sensor module 2A, and the screw hole 211 of the third sensor module 2C overlaps with the screw hole 212 of the first sensor module 2A. Therefore, for example, by fastening the first sensor module 2A and the third sensor module 2C together, the first sensor module 2A and the third sensor module 2C can be fixed to the substrate 10. In the third sensor module 2C, at least one of the screw holes 211 and 212 may not be screwed.

Although different from FIG. 3, as illustrated in FIG. 12, the third sensor module 2C may overlap with not only the first sensor module 2A but also the second sensor module 2B in plan view, and the first quadrant Q1 of the third sensor module 2C and the first quadrant Q1 of the second sensor module 2B may be arranged to overlap with each other in plan view. In particular, at least a part of the third acceleration sensor 27C can be disposed so as to overlap with the second acceleration sensor 27B in plan view. Even in this case, the third acceleration sensor 27C can be disposed close to the first and second acceleration sensors 27A and 27B, and the same effect as described above can be obtained.

According to the above arrangement, the first acceleration sensor 27A, the second acceleration sensor 27B, and the third acceleration sensor 27C can be arranged close to each other. Therefore, it is possible to reduce a difference in acceleration received by the first acceleration sensor 27A, the second acceleration sensor 27B, and the third acceleration sensor 27C. This effect is particularly remarkable when the sensor unit 1 receives an angular velocity associated with rotation. Specifically, as illustrated in FIG. 3, when an angular velocity ω around an axis Jy parallel to the Y-axis, which is located away from the substrate 10, is applied to the sensor unit 1, the first acceleration sensor 27A, the second acceleration sensor 27B, and the third acceleration sensor 27C are close to each other, so that a difference in an acceleration Az received by the first acceleration sensor 27A, the second acceleration sensor 27B, and the third acceleration sensor 27C is reduced. Therefore, the sensor unit 1 can detect the acceleration with high accuracy.

The sensor unit 1 can detect an acceleration Ax in the X-axis direction, an acceleration Ay in the Y-axis direction, an acceleration Az in the Z-axis direction, an angular velocity ωx around the X-axis, an angular velocity ωy around the Y-axis, and an angular velocity ωz around the Z-axis.

The acceleration Ax is obtained as an average value of the acceleration Ab applied to the first acceleration sensor 27A, the acceleration Aa applied to the second acceleration sensor 27B, and the acceleration Aa applied to the third acceleration sensor 27C. Specifically, the positive side of the first sensor module 2A in the b-axis direction and the positive side of the third sensor module 2C in the a-axis direction both face the positive side of the X-axis direction, and the positive side of the second sensor module 2B in the a-axis direction faces the negative side of the X-axis direction. Therefore, a detection signal S[2A]Ab of the acceleration Ab output from the first acceleration sensor 27A and a detection signal S[2C]Aa of the acceleration Aa output from the third acceleration sensor 27C are positive signals, and a detection signal S[2B]Aa of the acceleration Aa output from the second acceleration sensor 27B is a negative signal. Therefore, the acceleration Ax=(S[2A]Ab−S[2B]Aa+S[2C]Aa)/3.

The acceleration Ay is obtained as an average value of the acceleration Aa applied to the first acceleration sensor 27A, the acceleration Ab applied to the second acceleration sensor 27B, and the acceleration Ab applied to the third acceleration sensor 27C. Specifically, the positive side of the first sensor module 2A in the a-axis direction, the positive side of the second sensor module 2B in the b-axis direction, and the positive side of the third sensor module 2C in the b-axis direction all face the negative side of Y-axis direction. Therefore, a detection signal S[2A]Aa of the acceleration Aa output from the first acceleration sensor 27A, a detection signal S[2B]Ab of the acceleration Ab output from the second acceleration sensor 27B, and a detection signal S[2C]Ab of the acceleration Ab output from the third acceleration sensor 27C are respectively negative signals. Therefore, the acceleration Ay=(−S[2A]Aa−S[2B]Ab−S[2C]Ab)/3.

The acceleration Az is obtained as an average value of the acceleration Ac applied to the first acceleration sensor 27A, the acceleration Ac applied to the second acceleration sensor 27B, and the acceleration Ac applied to the third acceleration sensor 27C. Specifically, the positive side of the first sensor module 2A in the c-axis direction and the positive side of the second sensor module 2B in the c-axis direction both face the positive side of the Z-axis direction, and the positive side of the third sensor module 2C in the c-axis direction faces the negative side of the Z-axis direction. Therefore, a detection signal S[2A]Ac of the acceleration Ac output from the first acceleration sensor 27A and a detection signal S[2B]Ac of the acceleration Ac output from the second acceleration sensor 27B are positive signals, and a detection signal S[2C]Ac of the acceleration Ac output from the third acceleration sensor 27C is a negative signal. Therefore, the acceleration Az=(S[2A]Ac+S[2B]Ac−S[2C]Ac)/3.

The angular velocity $\omega x$ is obtained by an average value of the angular velocity $\omega b$ applied to the angular velocity sensor 26b of the first sensor module 2A, the angular velocity $\omega a$ applied to the angular velocity sensor 26a of the second sensor module 2B, and the angular velocity $\omega a$ applied to the angular velocity sensor 26a of the third sensor module 2C. Specifically, the positive side of the first sensor module 2A in the b-axis direction and the positive side of the third sensor module 2C in the a-axis direction both face the positive side of the X-axis direction, and the positive side of the second sensor module 2B in the a-axis direction faces the negative side of the X-axis direction. Therefore, a detection signal S[2A]$\omega b$ of the angular velocity $\omega b$ output from the angular velocity sensor 26b of the first sensor module 2A and a detection signal S[2C]$\omega a$ of the angular velocity $\omega a$ output from the angular velocity sensor 26a of the third sensor module 2C are positive signals, and a detection signal S[2B]$\omega a$ of the angular velocity $\omega a$ output from the angular velocity sensor 26a of the second sensor module 2B is a negative signal. Therefore, the angular velocity $\omega x$=(S[2A]$\omega b$−S[2B]$\omega a$+S[2C]$\omega a$)/3.

The angular velocity $\omega y$ is obtained by an average value of the angular velocity $\omega a$ applied to the angular velocity sensor 26a of the first sensor module 2A, the angular velocity $\omega b$ applied to the angular velocity sensor 26b of the second sensor module 2B, and the angular velocity $\omega b$ applied to the angular velocity sensor 26b of the third sensor module 2C. Specifically, the positive side of the first sensor module 2A in the a-axis direction, the positive side of the second sensor module 2B in the b-axis direction, and the positive side of the third sensor module 2C in the b-axis direction all face the negative side of Y-axis direction. Therefore, a detection signal S[2A]$\omega a$ of the angular velocity $\omega a$ output from the angular velocity sensor 26a of the first sensor module 2A, a detection signal S[2B]$\omega b$ of the angular velocity $\omega b$ output from the angular velocity sensor 26b of the second sensor module 2B, and a detection signal S[2C]$\omega b$ of the angular velocity $\omega b$ output from the angular velocity sensor 26b of the third sensor module 2C are respectively negative signals. Therefore, the angular velocity $\omega y$=(−S[2A]$\omega a$−S[2B]$\omega b$−S[2C]$\omega b$)/3.

The angular velocity $\omega z$ is obtained by an average value of the angular velocity $\omega c$ applied to the angular velocity sensor 26c of the first sensor module 2A, the angular velocity $\omega c$ applied to the angular velocity sensor 26c of the second sensor module 2B, and the angular velocity $\omega c$ applied to the angular velocity sensor 26c of the third sensor module 2C. Specifically, the positive side of the first sensor module 2A in the c-axis direction and the positive side of the second sensor module 2B in the c-axis direction both face the positive side of the Z-axis direction, and the positive side of the third sensor module 2C in the c-axis direction faces the negative side of the Z-axis direction. Therefore, a detection signal S[2A]$\omega c$ of the angular velocity $\omega c$ output from the angular velocity sensor 26c of the first sensor module 2A and a detection signal S[2B]$\omega c$ of the angular velocity $\omega c$ output from the angular velocity sensor 26c of the second sensor module 2B are positive signals, and a detection signal S[2C]$\omega c$ of the angular velocity $\omega c$ output from the angular velocity sensor 26c of the third sensor module 2C is a negative signal. Therefore, the angular velocity $\omega z$=(S[2A]$\omega c$+S[2B]$\omega c$−S[2C]$\omega c$)/3.

In this manner, it is possible to reduce a noise density up to $1/\sqrt{3}$ by respectively obtaining the acceleration Ax, the acceleration Ay, the acceleration Az, the angular velocity $\omega x$, the angular velocity $\omega y$, and the angular velocity $\omega z$ as the average values of the detection signals of the three sensor modules 2A, 2B, and 2C. Therefore, the sensor unit 1 can detect each of these inertias with high accuracy. A unit of the noise density is G/$\sqrt{Hz}$ for acceleration and dps/$\sqrt{Hz}$ for angular velocity.

Hereinbefore, the configuration of the sensor unit 1 is described. As described above, such a sensor unit 1 includes the substrate 10, the first sensor module 2A which is disposed at the substrate 10 and which includes the first acceleration sensor 27A, and the second sensor module 2B which is disposed at the substrate 10 and which includes the second acceleration sensor 27B. Further, the first sensor module 2A and the second sensor module 2B are arranged adjacent to each other on a lower surface side which is one surface of the substrate 10. The first acceleration sensor 27A is eccentrically disposed at the second sensor module 2B side in the first sensor module 2A, and the second acceleration sensor 27B is eccentrically disposed at the first sensor module 2A side in the second sensor module 2B. With this configuration, the first acceleration sensor 27A and the second acceleration sensor 27B can be arranged close to each other. Therefore, it is possible to reduce a difference in acceleration received by the first acceleration sensor 27A and the second acceleration sensor 27B. Further, the noise density can be reduced up to $1/\sqrt{2}$ by averaging the detection signals of the two sensor modules 2A and 2B. Therefore, the sensor unit 1 can detect the acceleration with high accuracy.

As described above, when an axis along a direction in which the first sensor module 2A and the second sensor module 2B are lined up is the X-axis and an axis orthogonal to the X-axis in plan view of the substrate 10 is the Y-axis, the first acceleration sensor 27A is located closer to the second sensor module 2B side than the virtual line Ly1 which intersects with the center O of the first sensor module 2A and extends in the direction along the Y-axis, and the second acceleration sensor 27B is located closer to the first sensor module 2A side than the virtual line Ly2 which intersects with the center O of the second sensor module 2B and extends in the direction along the Y-axis. Accordingly, the first acceleration sensor 27A and the second acceleration sensor 27B can be arranged close to each other. Therefore, it is possible to reduce a difference in acceleration received by the first acceleration sensor 27A and the second acceleration sensor 27B. For example, the second acceleration sensor 27B may be disposed so as to be located at a position corresponding to the fourth quadrant Q4 in FIG. 3. That is, the first acceleration sensor 27A and the second acceleration sensor 27B may be arranged so as to be displaced in the Y-axis direction.

As described above, when the axis along the direction in which the first sensor module 2A and the second sensor module 2B are lined up is the X-axis, and the axis orthogonal to the X-axis in plan view of the substrate 10 is the Y-axis, among four quadrants divided by the virtual line La which intersects with the center O of the first sensor module 2A and extends in the direction along the Y-axis and the virtual line Lb which intersects with the center O of the first sensor module 2A and extends in the direction along the X-axis, the first acceleration sensor 27A is located in the first quadrant Q1 which is one of two quadrants located at the second sensor module 2B side. In addition, among four quadrants divided by the virtual line Lb which intersects with the center O of the second sensor module 2B and extends in the direction along the Y-axis and the virtual line La which intersects with the center O of the second sensor module 2B and extends in the direction along the X-axis, the second acceleration sensor 27B is located in the first quadrant Q1 which is a quadrant aligned in a direction along the X-axis with the quadrant in which the first acceleration sensor 27A is disposed, of two quadrants located at the first sensor module 2A side. Accordingly, the first acceleration sensor 27A and the second acceleration sensor 27B can be arranged closer to each other. Therefore, it is possible to further reduce the difference in acceleration received by the first acceleration sensor 27A and the second acceleration sensor 27B.

Further, as described above, the sensor unit 1 includes the third sensor module 2C which is disposed at the substrate 10 and which includes the third acceleration sensor 27C. Further, the third sensor module 2C is located at the upper surface side which is the other surface of the substrate 10, and is disposed so as to overlap with the first sensor module 2A in plan view of the substrate 10. Further, in plan view of the substrate 10, the third acceleration sensor 27C is eccentrically disposed at the second sensor module 2B side in the third sensor module 2C. With this configuration, the first acceleration sensor 27A, the second acceleration sensor 27B, and the third acceleration sensor 27C can be arranged close to each other. Therefore, it is possible to reduce a difference in acceleration received by the first acceleration sensor 27A, the second acceleration sensor 27B, and the third acceleration sensor 27C. Further, the noise density can be reduced up to $1/\sqrt{3}$ by averaging the detection signals of the three sensor modules 2A, 2B, and 2C. Therefore, the sensor unit 1 can detect the acceleration with high accuracy.

As described above, the sensor unit 1 includes the control portion 100 controlling driving of the first sensor module 2A, the second sensor module 2B, and the third sensor module 2C. In addition, the control portion 100 is located at the upper surface side which is the other surface of the substrate 10, and is disposed to overlap with the second sensor module 2B in plan view of the substrate 10. Accordingly, spaces at the upper surface and the lower surface of the substrate 10 can be effectively used without waste. Therefore, the substrate 10 can be downsized, and the sensor unit 1 can be downsized accordingly.

Further, as described above, the first sensor module 2A, the second sensor module 2B, and the third sensor module 2C respectively include the angular velocity sensors 26a, 26b, and 26c. Accordingly, the sensor unit 1 becomes a composite sensor unit capable of detecting an acceleration and an angular velocity. Therefore, convenience of the sensor unit 1 is enhanced.

Further, as described above, the angular velocity sensors 26a, 26b, 26c include the oscillator 31 which is a crystal oscillator. By using the crystal oscillator as the oscillator 31, for example, it is possible to exhibit excellent temperature characteristics as compared when the MEMS silicon oscillator is used. Therefore, the angular velocity sensors 26a, 26b, and 26c can respectively detect the angular velocities ωa, ωb, and ωc with high accuracy.

Second Embodiment

Figure 13:
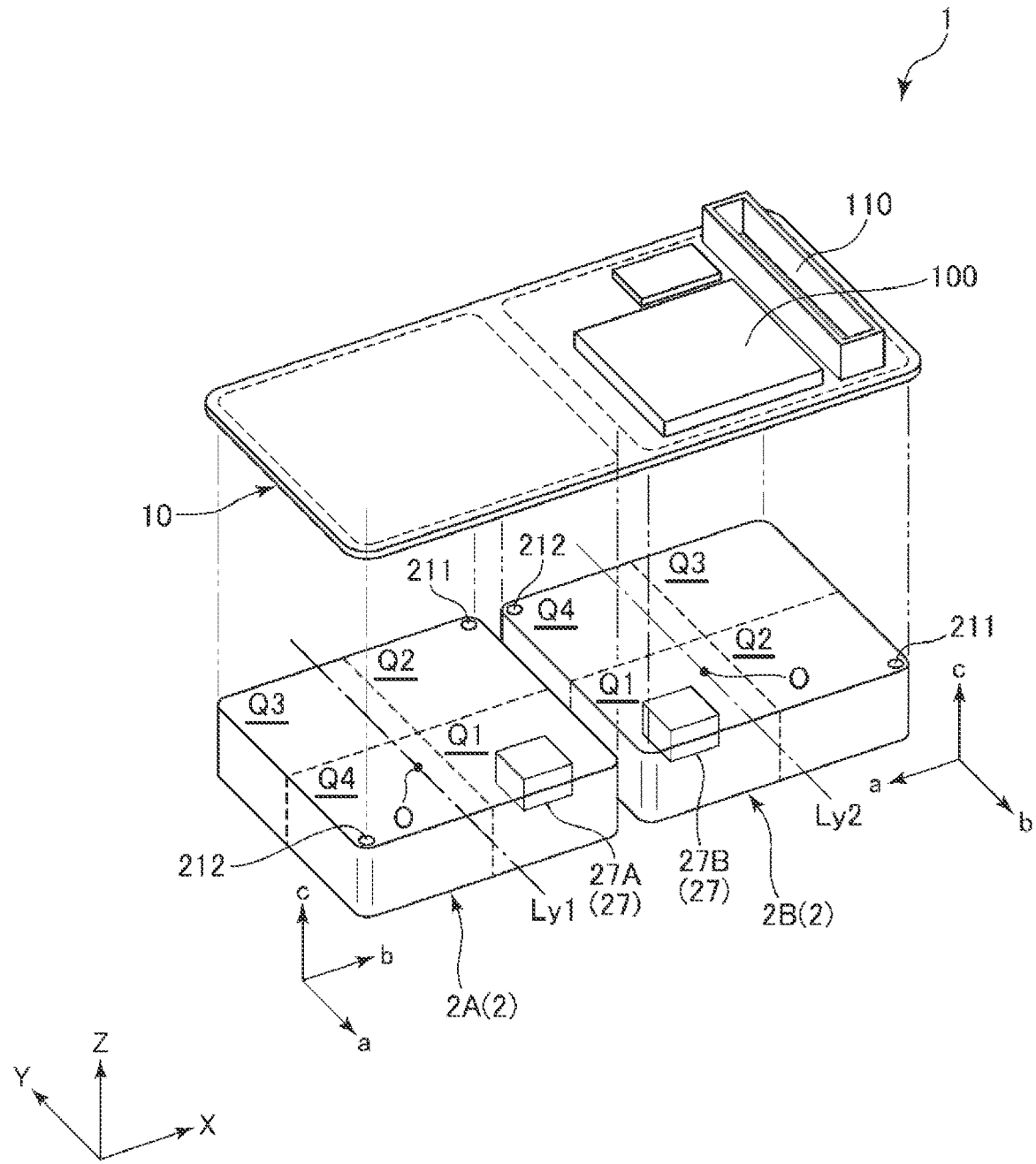
FIG. 13 is an exploded perspective view illustrating a sensor unit according to a second embodiment.

FIG. 13 is an exploded perspective view illustrating a sensor unit according to a second embodiment.

The sensor unit 1 according to the present embodiment has the same manner as the sensor unit 1 of the first embodiment described above except that the number of the sensor modules 2 is different. In the following description, the sensor unit 1 according to the second embodiment will be described focusing on differences from the first embodiment described above, and the description of the same matters will be omitted. Further, in FIG. 13, the container 9 is not illustrated. Further, in FIG. 13, the same components as those in the above-described embodiment are denoted by the same reference numerals.

As illustrated in FIG. 13, the sensor unit 1 according to the present embodiment includes the first sensor module 2A and the second sensor module 2B. That is, the sensor unit 1 according to the present embodiment has a configuration in which the third sensor module 2C is omitted from the sensor unit according to the first embodiment described above.

According to the second embodiment as described above, the same effect as that of the first embodiment can be obtained.

Third Embodiment

Figure 14:
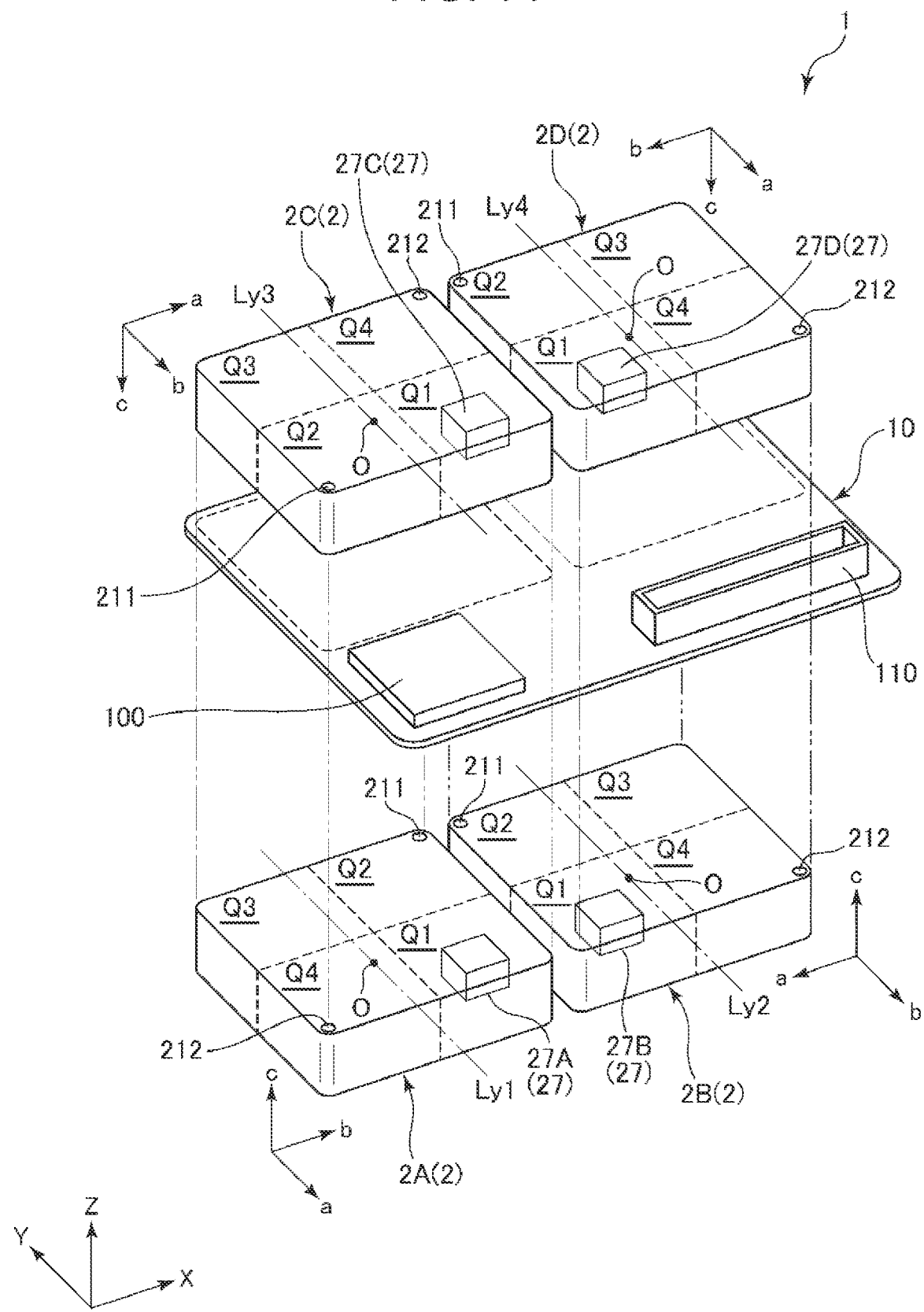
FIG. 14 is an exploded perspective view illustrating a sensor unit according to a third embodiment.
Figure 15:
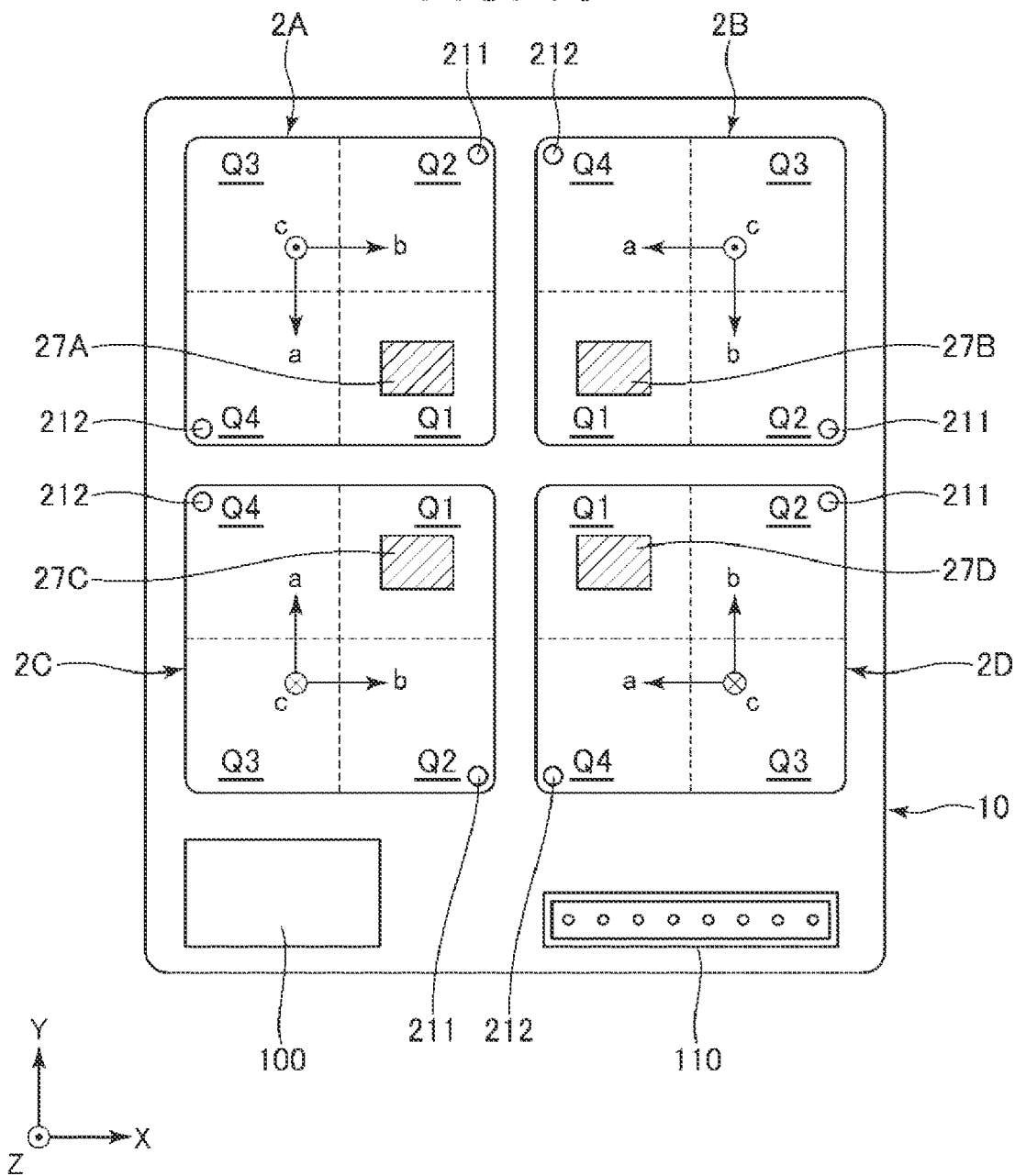
FIG. 15 is a plan view illustrating a modification example.

FIG. 14 is an exploded perspective view illustrating a sensor unit according to a third embodiment. FIG. 15 is a plan view illustrating a modification example.

The sensor unit 1 according to the present embodiment has the same manner as the sensor unit 1 of the first embodiment described above except that the number of the sensor modules 2 is different. In the following description, the sensor unit 1 according to the third embodiment will be described focusing on differences from the first embodiment described above, and the description of the same matters will be omitted. Further, in FIG. 14, the container 9 is not illustrated. Further, in FIG. 14, the same components as those in the above-described embodiment are denoted by the same reference numerals.

As illustrated in FIG. 14, the sensor unit 1 according to the present embodiment has the first sensor module 2A, the second sensor module 2B, the third sensor module 2C, and a fourth sensor module 2D. That is, the sensor unit 1 according to the present embodiment has a configuration in which the fourth sensor module 2D is added to the sensor unit according to the first embodiment described above.

The fourth sensor module 2D has the same configuration as the other sensor modules 2A, 2B, and 2C. Further, hereinafter, for convenience of description, the acceleration sensor 27 included in the fourth sensor module 2D is also referred to as a "fourth acceleration sensor 27D".

The fourth sensor module 2D is disposed at the upper surface of the substrate 10. The fourth sensor module 2D is disposed side by side with the third sensor module 2C in the X-axis direction and is disposed side by side with the second sensor module 2B in the Z-axis direction. That is, the fourth sensor module 2D is disposed to face the second sensor module 2B via the substrate 10, and overlaps with the second sensor module 2B in plan view from the Z-axis direction. In particular, in the present embodiment, the centers O of the fourth sensor module 2D and the second sensor module 2B overlap with each other.

The fourth sensor module 2D is disposed so that the a-axis coincides with the Y-axis, the b-axis coincides with the X-axis, and the c-axis coincides with the Z-axis, and the positive side of the a-axis direction faces the negative side of the Y-axis direction, the positive side of the b-axis direction faces the negative side of the X-axis direction, and the positive side of the c-axis direction faces the negative side of the Z-axis direction. That is, the fourth sensor module 2D has a posture rotated by 180° around the X-axis based on the second sensor module 2B, and further rotated by 90° around the Z-axis.

With this arrangement, the fourth acceleration sensor 27D is eccentrically disposed at the first sensor module 2A and the third sensor module 2C sides inside the fourth sensor module 2D. Specifically, the fourth acceleration sensor 27D is located closer to the first sensor module 2A and the third sensor module 2C sides than a virtual line Ly4 which intersects with the center O of the fourth sensor module 2D and which extends in the direction along the Y-axis, that is, on the negative side of the X-axis direction. Therefore, the fourth acceleration sensor 27D can be disposed to be close to the first acceleration sensor 27A, the second acceleration sensor 27B, and the third acceleration sensor 27C. Accordingly, it is possible to reduce a difference in acceleration received by the first acceleration sensor 27A, the second acceleration sensor 27B, the third acceleration sensor 27C, and the fourth acceleration sensor 27D.

In particular, in the present embodiment, the first quadrant Q1 of the fourth sensor module 2D in which the fourth acceleration sensor 27D is located and the first quadrant Q1 of the second sensor module 2B in which the second acceleration sensor 27B is located are arranged side by side in the Z-axis direction. Therefore, the first acceleration sensor 27A, the second acceleration sensor 27B, the third acceleration sensor 27C, and the fourth acceleration sensor 27D can be arranged closer to each other. Accordingly, it is possible to further reduce the difference in acceleration received by the first acceleration sensor 27A, the second acceleration sensor 27B, the third acceleration sensor 27C, and the fourth acceleration sensor 27D.

In such a sensor unit 1, the acceleration Ax is obtained by an average value of the acceleration Ab applied to the first acceleration sensor 27A, the acceleration Aa applied to the second acceleration sensor 27B, the acceleration Aa applied to the third acceleration sensor 27C, and the acceleration Ab applied to the fourth acceleration sensor 27D. In particular, in the present embodiment, the positive side of the first sensor module 2A in the b-axis direction and the positive side of the third sensor module 2C in the a-axis direction both face the positive side of the X-axis direction, and the positive side of the second sensor module 2B in the a-axis direction and the positive side of the fourth sensor module 2D in the b-axis direction both face the negative side of the X-axis direction. Therefore, non-linear detection characteristics of these sensor modules 2A, 2B, 2C, and 2D can be canceled, and the acceleration Ax can be detected with higher accuracy.

Further, the acceleration Ay is obtained by an average value of the acceleration Aa applied to the first acceleration sensor 27A, the acceleration Ab applied to the second acceleration sensor 27B, the acceleration Ab applied to the third acceleration sensor 27C, and the acceleration Aa applied to the fourth acceleration sensor 27D.

The acceleration Az is obtained by an average value of the acceleration Ac applied to the first acceleration sensor 27A, the acceleration Ac applied to the second acceleration sensor 27B, the acceleration Ac applied to the third acceleration sensor 27C, and the acceleration Ac applied to the fourth acceleration sensor 27D. In particular, in the present embodiment, the positive side of the first sensor module 2A in the c-axis direction and the positive side of the second sensor module 2B in the c-axis direction both face the positive side of the Z-axis direction, and the positive side of the third sensor module 2C in the c-axis direction and the positive side of the fourth sensor module 2D in the c-axis direction both face the negative side of the Z-axis direction. Therefore, non-linear detection characteristics of these sensor modules 2A, 2B, 2C, and 2D can be canceled, and the acceleration Az can be detected with higher accuracy.

The angular velocity $\omega x$ is obtained by an average value of the angular velocity $\omega b$ applied to the angular velocity sensor $26b$ of the first sensor module 2A, the angular velocity $\omega a$ applied to the angular velocity sensor $26a$ of the second sensor module 2B, the angular velocity $\omega a$ applied to the angular velocity sensor $26a$ of the third sensor module 2C, and the angular velocity $\omega b$ applied to the angular velocity sensor $26b$ of the fourth sensor module 2D.

The angular velocity $\omega y$ is obtained by an average value of the angular velocity $\omega a$ applied to the angular velocity sensor $26a$ of the first sensor module 2A, the angular velocity $\omega b$ applied to the angular velocity sensor $26b$ of the second sensor module 2B, the angular velocity $\omega b$ applied to the angular velocity sensor $26b$ of the third sensor module 2C, and the angular velocity $\omega a$ applied to the angular velocity sensor $26a$ of the fourth sensor module 2D.

The angular velocity $\omega z$ is obtained by an average value of the angular velocity $\omega c$ applied to the angular velocity sensor $26c$ of the first sensor module 2A, the angular velocity $\omega c$ applied to the angular velocity sensor $26c$ of the second sensor module 2B, the angular velocity $\omega c$ applied to the angular velocity sensor $26c$ of the third sensor module 2C, and the angular velocity $\omega c$ applied to the angular velocity sensor $26c$ of the fourth sensor module 2D.

In this manner, by respectively obtaining the acceleration Ax, the acceleration Ay, the acceleration Az, the angular velocity $\omega x$, the angular velocity $\omega y$, and the angular velocity $\omega z$ as the average values of the detection signals of the four sensor modules 2A, 2B, 2C, and 2D, it is possible to reduce a noise density up to $1/\sqrt{4}$. Therefore, the sensor unit 1 can detect each of these inertias with high accuracy.

The sensor unit 1 as described above is disposed at the substrate 10, and has the fourth sensor module 2D having the fourth acceleration sensor 27D. The fourth sensor module 2D is located at the upper surface side which is the other surface of the substrate 10, and is disposed so as to overlap with the second sensor module 2B in plan view of the substrate 10. Further, in plan view of the substrate 10, the fourth acceleration sensor 27D is eccentrically disposed at the first sensor module 2A side in the fourth sensor module 2D. With this configuration, the first acceleration sensor 27A, the second acceleration sensor 27B, the third acceleration sensor 27C, and the fourth acceleration sensor 27D can be arranged close to each other. Therefore, it is possible to reduce the difference in acceleration received by the first acceleration sensor 27A, the second acceleration sensor 27B, the third acceleration sensor 27C, and the fourth acceleration sensor 27D. Further, by averaging the detection signals of the four sensor modules 2A, 2B, 2C, and 2D, it is possible to reduce the noise density up to $1/\sqrt{4}$. Therefore, the sensor unit 1 can detect acceleration with high accuracy.

According to the third embodiment as described above, the same effect as that of the first embodiment described above can be obtained. As a modification example according to the present embodiment, for example, as illustrated in FIG. 15, the first sensor module 2A, the second sensor module 2B, the third sensor module 2C, and the fourth sensor module 2D are all arranged on the upper surface side of the substrate 10, that is, on the same surface side.

Fourth Embodiment

Figure 16:
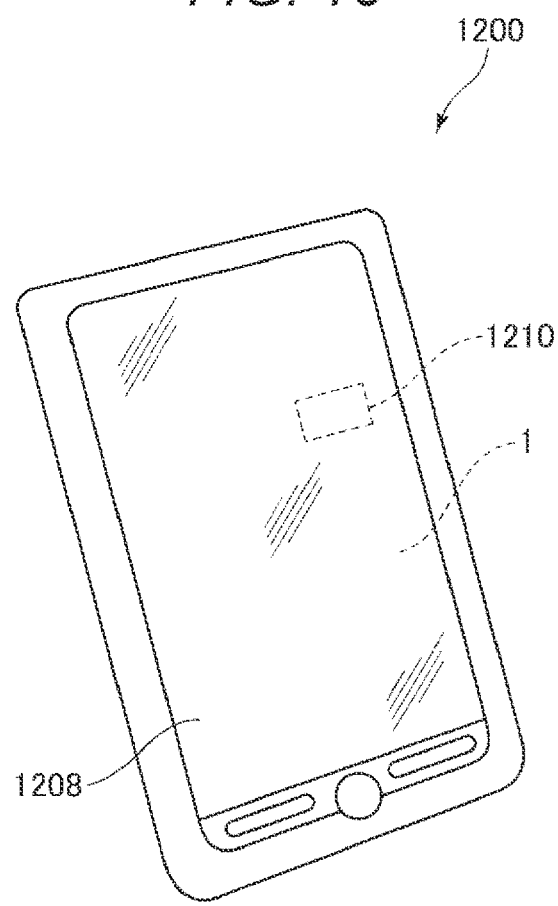
FIG. 16 is a perspective view illustrating a smartphone according to a fourth embodiment.

FIG. 16 is a perspective view illustrating a smartphone according to a fourth embodiment.

A smartphone 1200 as an electronic apparatus illustrated in FIG. 16 includes the sensor unit 1 and a control circuit 1210 which performs a control based on a detection signal output from the sensor unit 1. Detection data detected by the sensor unit 1 is transmitted to the control circuit 1210, and the control circuit 1210 recognizes a posture and behavior of the smartphone 1200 from the received detection data, so that an image displayed on a display portion 1208 can be changed, a warning sound or a sound effect can be emitted, and a vibration motor can be driven to vibrate a main body.

The smartphone 1200 as such an electronic apparatus includes the sensor unit 1 and the control circuit 1210 which performs a control based on a detection signal output from the sensor unit 1. Therefore, the effect of the sensor unit 1 described above can be obtained, and high reliability can be exhibited.

In addition to the smartphone 1200 described above, the electronic apparatus can be applied to, for example, a personal computer, a digital still camera, a tablet terminal, a timepiece, a smart watch, an ink jet printer, a TV, and a wearable terminal such as a head mounted display (HMD), a video camera, a car navigation apparatus, an electronic game apparatus, a word processor, a workstation, a videophone, a security TV monitor, an electronic binocular, a POS terminal, a medical apparatus, a fish detector, various measurement apparatuses, a moving object terminal base station apparatus, various instruments for a vehicle, an aircraft, and a ship, a flight simulator, a network server, and the like.

Fifth Embodiment

Figure 17:
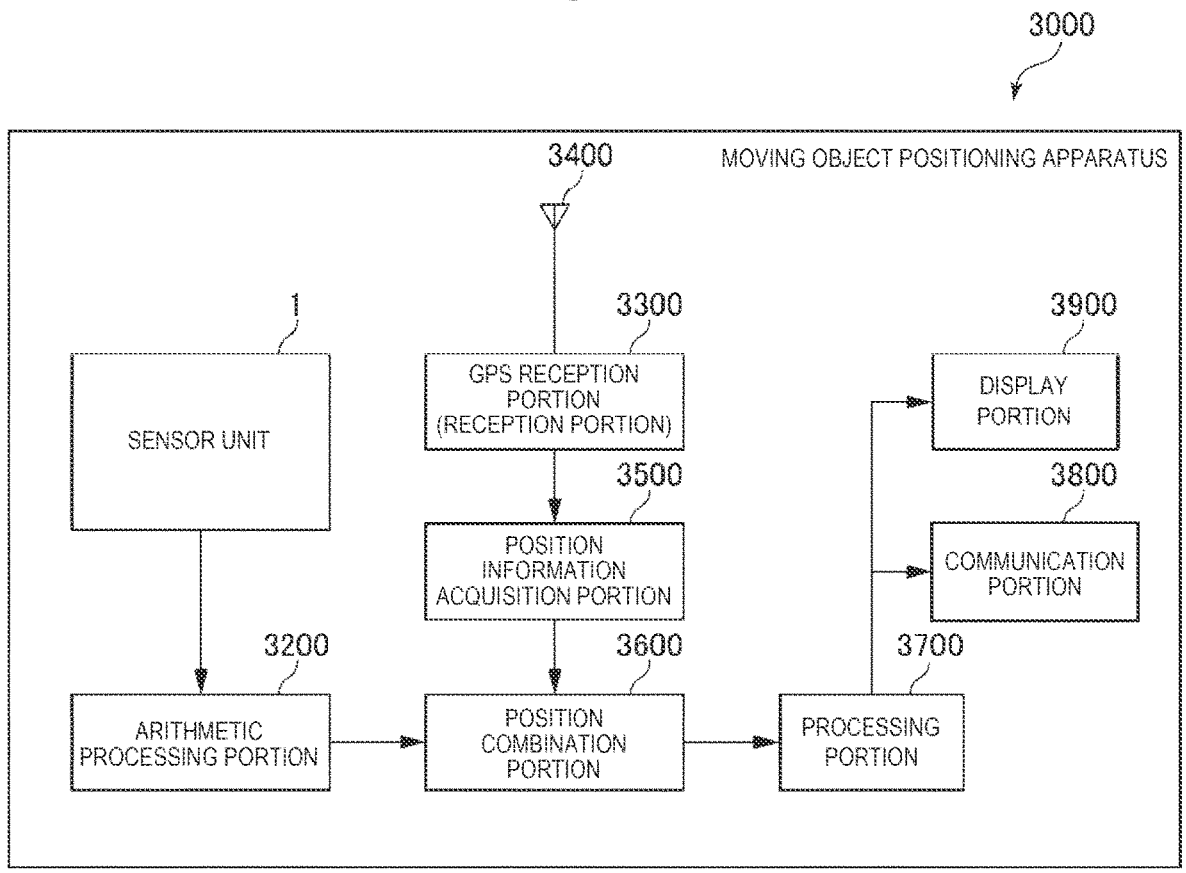
FIG. 17 is a block diagram illustrating an entire system of a moving object positioning apparatus according to a fifth embodiment.
Figure 18:
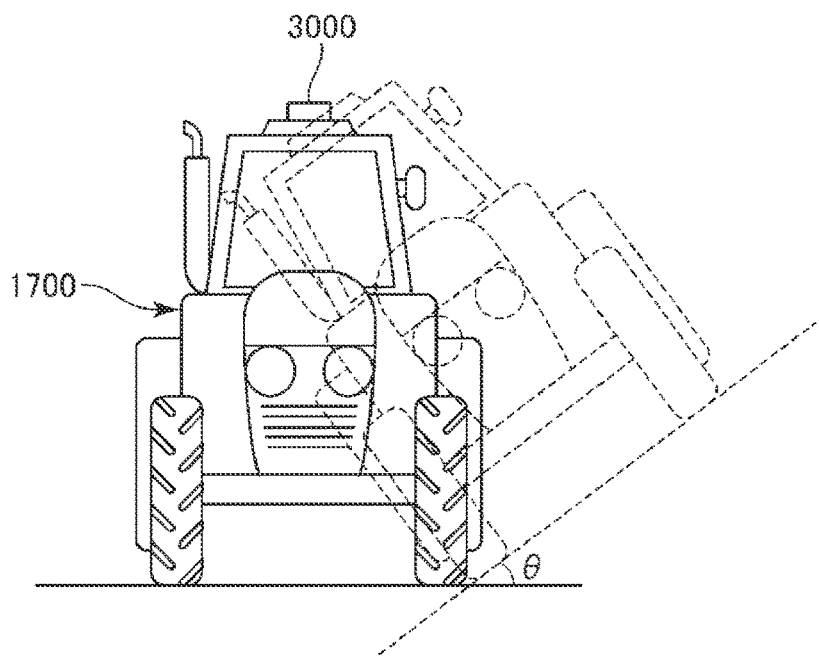
FIG. 18 is a diagram illustrating an operation of the moving object positioning apparatus illustrated in FIG. 17.
Figure 19:
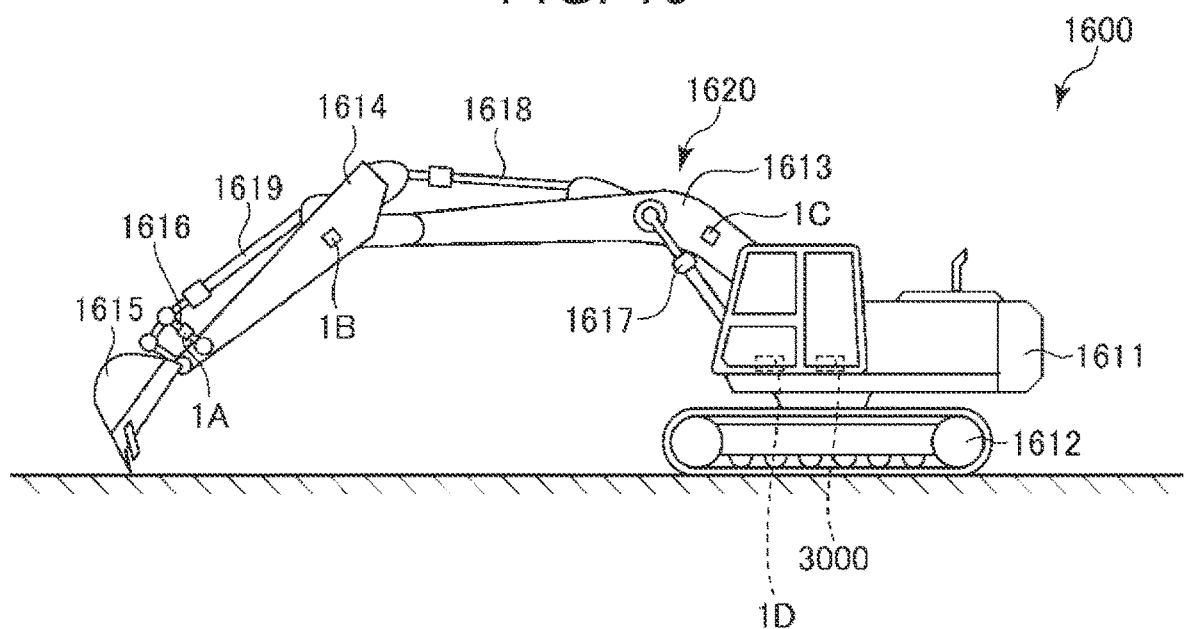
FIG. 19 is a side view illustrating a hydraulic excavator.

FIG. 17 is a block diagram illustrating an entire system of a moving object positioning apparatus according to a fifth embodiment. FIG. 18 is a diagram illustrating an operation of the moving object positioning apparatus illustrated in FIG. 17. FIG. 19 is a side view illustrating a hydraulic excavator.

A moving object positioning apparatus 3000 illustrated in FIG. 17 is an apparatus which is used by being mounted at a moving object to perform positioning of the moving object. The moving object is not particularly limited, and may be a bicycle, an automobile, a motorcycle, a train, an airplane, a ship, or the like, but in the present embodiment, a case where a tractor which is an example of an agricultural machine (a farming tool) is used as the moving object will be described.

The moving object positioning apparatus 3000 includes the sensor unit 1, an arithmetic processing portion 3200, a GPS reception portion 3300, a reception antenna 3400, a position information acquisition portion 3500, a position combination portion 3600, a processing portion 3700, a communication portion 3800, and a display portion 3900.

The arithmetic processing portion 3200 receives acceleration data and angular velocity data from the sensor unit 1, performs an inertial navigation arithmetic process on these pieces of data, and outputs inertial navigation positioning data including acceleration and a posture of the moving object. The GPS reception portion 3300 receives a signal from a GPS satellite via the reception antenna 3400. Further, the position information acquisition portion 3500 outputs GPS positioning data indicating a position (a latitude, a longitude, and an altitude), a speed, and an azimuth of the moving object positioning apparatus 3000 based on the signal received by the GPS reception portion 3300. The GPS positioning data also includes status data indicating a reception state, a reception time, and the like.

The position combination portion 3600 calculates a position of the moving object, specifically, which position on a ground the moving object is traveling, based on the inertial navigation positioning data output from the arithmetic processing portion 3200 and the GPS positioning data output from the position information acquisition portion 3500. For example, even when positions of moving objects included in the GPS positioning data are the same, as illustrated in FIG. 18, when postures of the moving objects are different from each other due to the influence of an inclination θ of the ground or the like, it means that the moving objects are traveling at different positions on the ground. Therefore, it is not possible to calculate an accurate position of the moving object only with the GPS positioning data. Therefore, the position combination portion 3600 uses the inertial navigation positioning data to calculate which position on the ground the moving object is traveling.

The processing portion 3700 performs a predetermined process on the position data output from the position combination portion 3600 and displays the position data on the display portion 3900 as a positioning result. Further, the position data may be transmitted to an external apparatus by the communication portion 3800.

In FIG. 18, an example in which the moving object positioning apparatus 3000 is mounted on a tractor 1700 which is an example of an agricultural machine (a farming tool) is described, but a target on which the moving object positioning apparatus 3000 is mounted is not particularly limited, and for example, a construction machine (a building machine) may be used. An example of the construction machine is a hydraulic excavator 1600 illustrated in FIG. 19, for example.

The hydraulic excavator 1600 illustrated in FIG. 19 is configured to include a lower traveling body 1612 of a vehicle body and an upper revolving body 1611 rotatably mounted on the lower traveling body 1612, and a working mechanism 1620 including a plurality of members which are rotatable in an upward-downward direction is provided on a front side of the upper revolving body 1611. A driver's seat (not illustrated) is provided in the upper revolving body 1611, and an operating apparatus (not illustrated) for operating each member constituting the working mechanism 1620 is provided in the driver's seat. A sensor unit 1D which functions as an inclination sensor which detects an inclination angle of the upper revolving body 1611 is disposed, in the upper revolving body 1611.

As the plurality of members, the working mechanism 1620 includes a boom 1613 lift-ably attached to a front side of the upper revolving body 1611, an arm 1614 lift-ably attached to a tip side of the boom 1613, a bucket link 1616 rotatably attached to a tip side of the arm 1614, a bucket 1615 rotatably attached to the tip sides of the arm 1614 and the bucket link 1616, a boom cylinder 1617 for driving the boom 1613, an arm cylinder 1618 for driving the arm 1614, and a bucket cylinder 1619 for driving the bucket 1615 via the bucket link 1616.

A base tip side of the boom 1613 is rotatably supported by the upper revolving body 1611 in an upward-downward direction, and the boom 1613 is rotationally driven relative to the upper revolving body 1611 by expansion and contraction of the boom cylinder 1617. A sensor unit 1C which functions as an inertial sensor which detects a state of movement of the boom 1613 is provided, in the boom 1613.

One tip side of the arm 1614 is rotatably supported on the tip side of the boom 1613, and the arm 1614 is rotationally driven relative to the boom 1613 by expansion and contraction of the arm cylinder 1618. A sensor unit 1B which functions as an inertial sensor which detects a movement state of the arm 1614 is provided, in the arm 1614.

The bucket link 1616 and the bucket 1615 are rotatably supported on the tip side of the arm 1614, and the bucket link 1616 is rotationally driven relative to the arm 1614 by expansion and contraction of the bucket cylinder 1619 and the bucket 1615 is rotationally driven relative to the arm 1614 in accordance with the driving. A sensor unit 1A which functions as an inertial sensor which detects a movement state of the bucket link 1616 is provided, in the bucket link 1616.

As the sensor units 1A, 1B, 1C, and 1D, the sensor unit 1 according to the embodiment described above can be used. The sensor units 1A, 1B, 1C, and 1D can detect at least one of an angular velocity and an acceleration acting on each member of the working mechanism 1620 and the upper revolving body 1611. The arithmetic processing portion 3200 receives acceleration data and angular velocity data from the sensor units 1A, 1B, 1C, and 1D, performs an inertial navigation arithmetic process on these pieces of data, and outputs inertial navigation positioning data including acceleration and a posture of the moving object.

Sixth Embodiment

Figure 20:
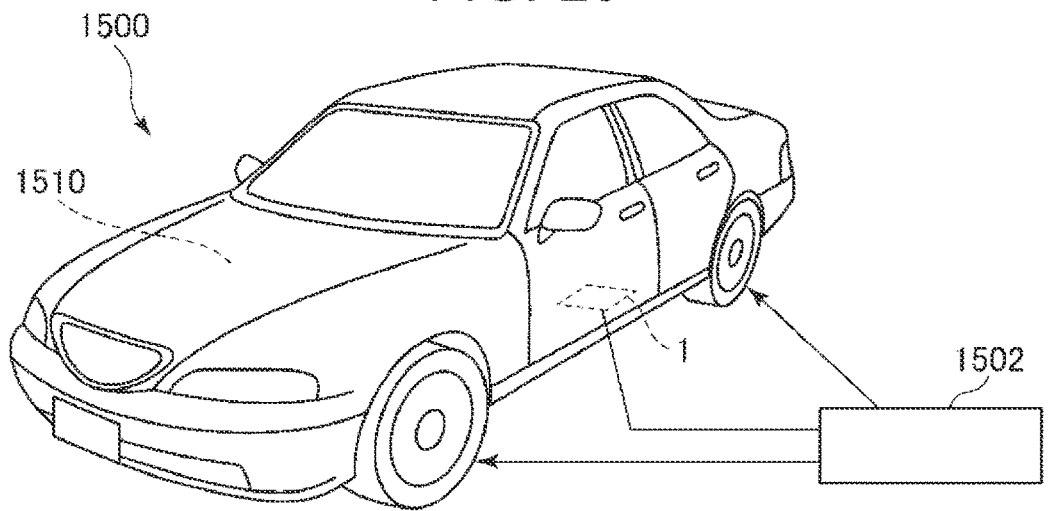
FIG. 20 is a perspective view illustrating an automobile according to a sixth embodiment.

FIG. 20 is a perspective view illustrating an automobile according to a sixth embodiment.

An automobile 1500 as a moving object illustrated in FIG. 20 includes a system 1510 of at least one of an engine system, a brake system, and a keyless entry system, the sensor unit 1, and the control circuit 1502, and can detect a posture of a vehicle body by the sensor unit 1. A detection signal of the sensor unit 1 is supplied to the control circuit 1502, and the control circuit 1502 can control the system 1510 based on the signal.

In this manner, the automobile 1500 as a moving object has the sensor unit 1 and the control circuit 1502 which performs a control based on the detection signal output from the sensor unit 1. Therefore, the automobile 1500 can obtain the effect of the sensor unit 1 described above, and can exhibit high reliability.

In addition, the sensor unit 1 is also widely applied to an electronic control unit (ECU) such as a car navigation system, a car air conditioner, an anti-lock brake system (ABS), an airbag, a tire pressure monitoring system (TPMS), an engine control, a battery monitor for a hybrid automobile or an electric automobile. Further, the moving object is not limited to the automobile 1500, and may be applied to, for example, the agricultural machine and the construction machine described above, an airplane, a rocket, an artificial satellite, a ship, an automated guided vehicle (AGV), a biped robot, an unmanned airplane such as a drone, or the like.

Hereinbefore, a sensor unit, an electronic apparatus, and a moving object according to the present disclosure are described based on the illustrated embodiments, but the present disclosure is not limited thereto and the configuration of each portion can be replaced with any configuration having the same function. Further, any other component may be added to the present disclosure. In addition, the respective embodiments may be appropriately combined.

What is claimed is:

1. A sensor unit comprising:
    a substrate having a first surface parallel to a first direction and a second direction intersecting the first direction;
    a first sensor module disposed on the first surface of the substrate and including one or a plurality of acceleration sensors;
    a second sensor module disposed on the first surface of the substrate and including one or a plurality of acceleration sensors; and
    a third sensor module disposed on a second surface of the substrate opposite to the first surface and including one or a plurality of acceleration sensors, wherein
    the first sensor module and the second sensor module are arranged adjacent to each other on the first surface of the substrate such that the first sensor module and the second sensor module are arranged side by side along the first direction,
    all of the one or the plurality of acceleration sensors included in the first sensor module are positionally biased toward a second sensor module side within the first sensor module when viewed from a direction perpendicular to the first surface of the substrate such that the one or the plurality of acceleration sensors included in the first sensor module are located closer to the second sensor module than a virtual line that intersects a center of the first sensor module and extends in the second direction,
    all of the one or the plurality of acceleration sensors included in the second sensor module are positionally biased toward a first sensor module side within the second sensor module when viewed from the direction perpendicular to the first surface of the substrate such that the one or the plurality of acceleration sensors included in the second sensor module are located closer to the first sensor module than a virtual line that intersects a center of the second sensor module and extends in the second direction, and such that the one or the plurality of acceleration sensors included in the first sensor module and the one or the plurality of acceleration sensors included in the second sensor module are arranged close to each other,
    the third sensor module is arranged to overlap the first sensor module when viewed from the direction perpendicular to the first surface of the substrate, and
    all of the one or the plurality of acceleration sensors included in the third sensor module are positionally biased toward the second sensor module side within the third sensor module when viewed from the direction perpendicular to the first surface of the substrate.

2. The sensor unit according to claim 1, wherein
    the one or the plurality of acceleration sensors included in the first sensor module are located in one of two quadrants located at the second sensor module side, among four quadrants divided by a virtual line which intersects with the center of the first sensor module and extends in the first direction and the virtual line which intersects with the center of the first sensor module and extends in the second direction, and the one or the plurality of acceleration sensors included in the second sensor module are located in one of two quadrants located at the first sensor module side, among four quadrants divided by a virtual line which intersects with the center of the second sensor module and extends in the first direction and the virtual line which intersects with the center of the second sensor module and extends in the second direction.

3. The sensor unit according to claim 1, further comprising:
a control portion that controls driving of the first sensor module, the second sensor module, and the third sensor module, wherein
the control portion is disposed at the second surface of the substrate, and is disposed to overlap with the second sensor module when viewed from the direction perpendicular to the first surface of the substrate.

4. The sensor unit according to claim 1, further comprising:
a fourth sensor module that is disposed at the second surface of the substrate and including one or a plurality of acceleration sensors, wherein
the fourth sensor module is disposed to overlap with the second sensor module when viewed from the direction perpendicular to the first surface of the substrate, and
all of the one or the plurality of acceleration sensors included in the fourth sensor module are positionally biased toward the first sensor module side within the fourth sensor module when viewed from the direction perpendicular to the first surface of the substrate.

5. The sensor unit according to claim 1, wherein
each of the first sensor module and the second sensor module includes an angular velocity sensor.

6. The sensor unit according to claim 5, wherein
the angular velocity sensor includes a crystal oscillator.

7. An electronic apparatus comprising:
the sensor unit according to claim 1; and
a control circuit that performs a control based on a detection signal output from the sensor unit.

8. A moving object comprising:
the sensor unit according to claim 1; and
a control circuit that performs a control based on a detection signal output from the sensor unit.

* * * * *